(12) United States Patent
Doi et al.

(10) Patent No.: US 7,283,920 B2
(45) Date of Patent: Oct. 16, 2007

(54) APPARATUS AND METHOD FOR TESTING SEMICONDUCTOR DEVICE

(75) Inventors: Masaru Doi, Tokyo (JP); Takeo Miura, Tokyo (JP)

(73) Assignee: Advantest Corporation, Tokyo (JP)

( * ) Notice: Subject to any disclaimer, the term of this patent is extended or adjusted under 35 U.S.C. 154(b) by 573 days.

(21) Appl. No.: 10/732,763

(22) Filed: Dec. 10, 2003

(65) Prior Publication Data
US 2004/0122620 A1    Jun. 24, 2004

Related U.S. Application Data

(63) Continuation of application No. PCT/JP02/05924, filed on Jun. 13, 2002.

(30) Foreign Application Priority Data
Jun. 13, 2001    (JP)    ............... 2001-179106

(51) Int. Cl.
G01M 19/00    (2006.01)
(52) U.S. Cl. .................................... 702/125
(58) Field of Classification Search ............... 702/125
See application file for complete search history.

(56) References Cited
U.S. PATENT DOCUMENTS
5,579,251 A    11/1996    Sato 6,016,565 A    1/2000    Miura
6,789,224 B2 *    9/2004    Miura ................ 714/744

FOREIGN PATENT DOCUMENTS
JP    2000-162290    6/2000
JP    2000162290 A *    6/2000
JP    2001-201532    7/2001
JP    2001201532 A *    7/2001
JP    2002-25294    1/2002

OTHER PUBLICATIONS

German Office Action issued in German Patent Application No. 102 96 952.3-35 dated Jul. 4, 2006 and Englsih Translation thereof, 15 pages.
Patent Abstracts of Japan, Publication No. 02-118474 dated May 2, 1990, 2 pgs.
Patent Abstract of Japan, Publication No. 2000-149593 dated May 30, 2000, 2 pgs.

(Continued)

Primary Examiner—John Barlow
Assistant Examiner—Lisa Sievers
(74) Attorney, Agent, or Firm—Osha Liang LLP

(57) ABSTRACT

A phase difference between a timing of rising or falling of the data read from a semiconductor device to be test and a timing of rising or falling of a reference clock outputted synchronized with the data is measured by operating sampling with strobe pulses configured with multi-phase pulses given the phase difference by a small amount in regard to the timing of the data and the timing of the reference clock. In addition, a glitch of the data is detected, and the quality of the semiconductor device to be tested is judged based on the phase difference and/or the glitch.

54 Claims, 28 Drawing Sheets

OTHER PUBLICATIONS

Patent Abstract of Japan, Publication No. 2000-162290 dated Jun. 16, 2000, 2 pgs.
Patent Abstract of Japan, Publication No. 09-097196 dated Apr. 8, 1997, 2 pgs.
Patent Abstract of Japan, Publication No. 2001-201532 dated Jul. 27, 2001, 2 pgs.
Patent Abstract of Japan, Publication No. 2002-025294 dated Jan. 25, 2002, 2 pgs.
Patent Abstract of Japan, Publication No. 2002-196053 dated Jul. 10, 2002, 2 pgs.
International Search Report issued in Int'l Application No. PCT/JP02/05924 mailed on Sep. 24, 2002, 3 pgs.

* cited by examiner

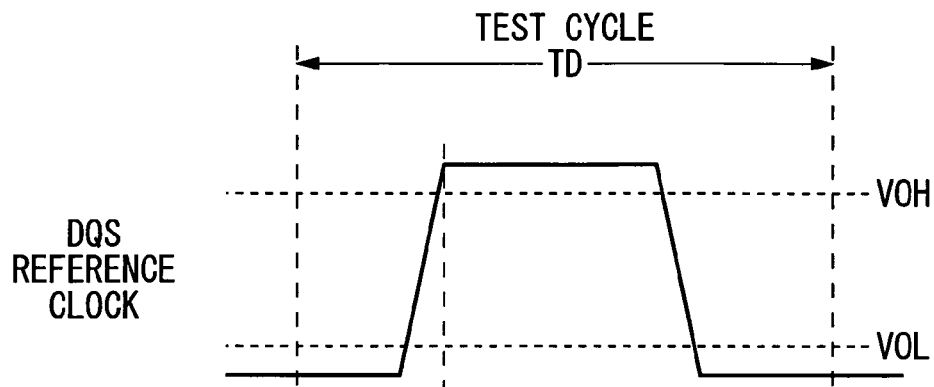
FIG. 3A  DQS REFERENCE CLOCK
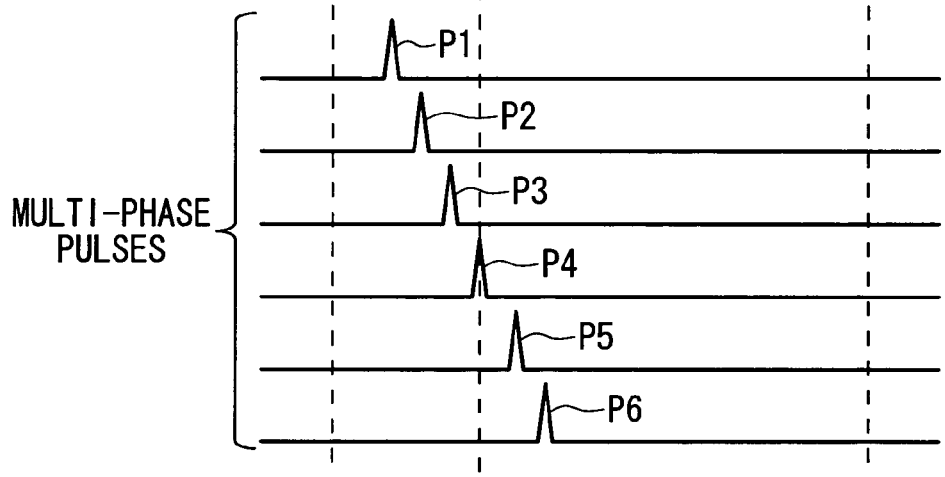
FIG. 3B  MULTI-PHASE PULSES
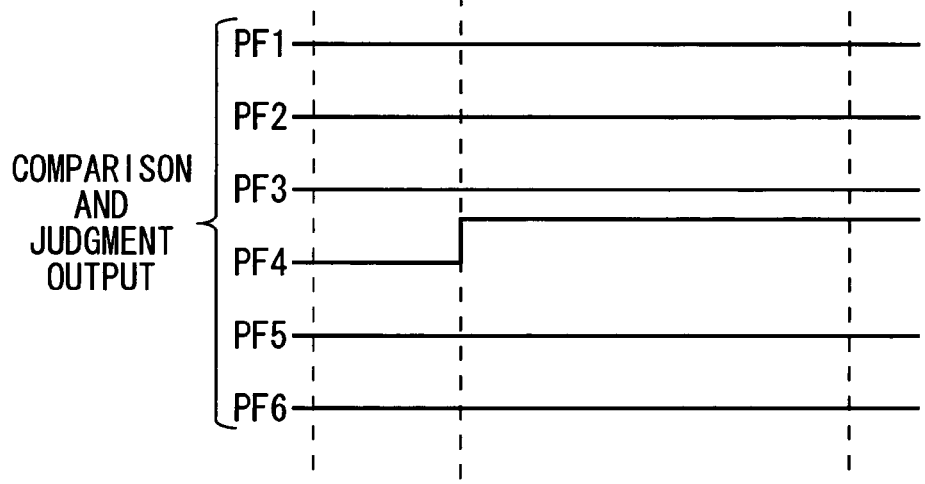
FIG. 3C  COMPARISON AND JUDGMENT OUTPUT

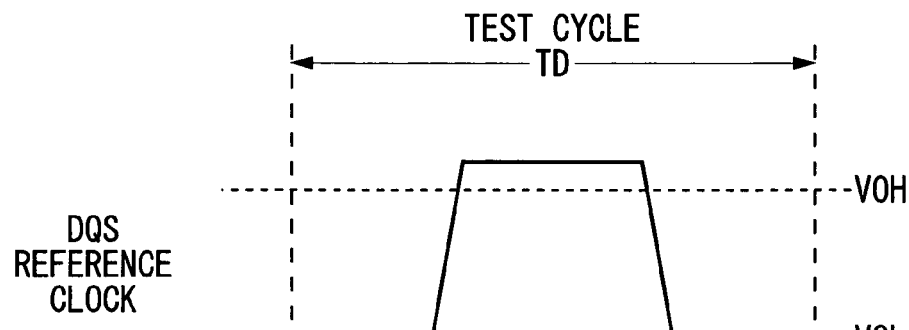
FIG. 4A  DQS REFERENCE CLOCK
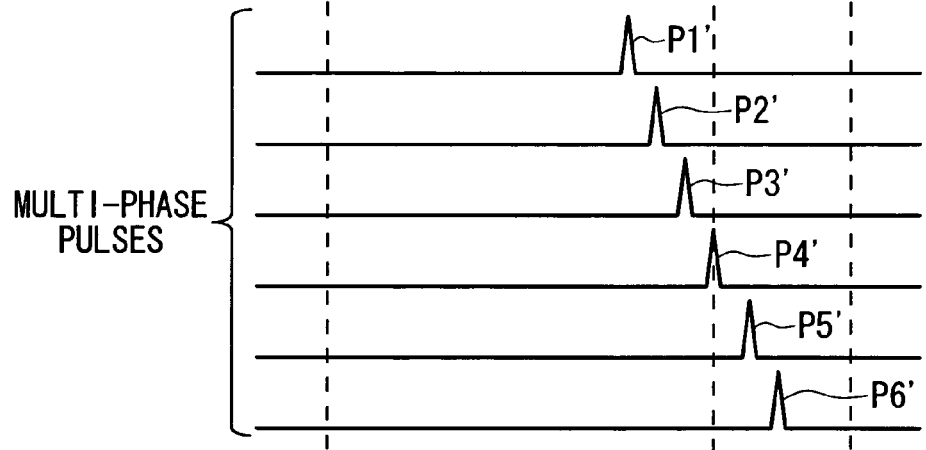
FIG. 4B  MULTI-PHASE PULSES
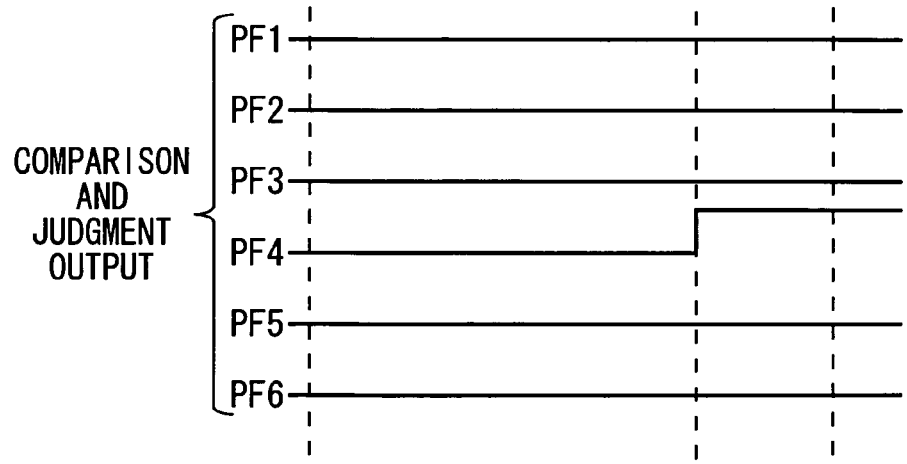
FIG. 4C  COMPARISON AND JUDGMENT OUTPUT

|   | 8 | 7 | 6 | 5 | 4 | 3 | 2 | 1 | 0 |
|---|---|---|---|---|---|---|---|---|---|
|   | 7 | 6 | 5 | 4 | 3 | 2 | 1 | 0 | -1 |
|   | 6 | 5 | 4 | 3 | 2 | 1 | 0 | -1 | -2 |
| DNO ↑ DATA STROBE NUMBER | 5 | 4 | 3 | 2 | 1 | 0 | -1 | -2 | -3 |
|   | 4 | 3 | 2 | 1 | 0 | -1 | -2 | -3 | -4 |
|   | 3 | 2 | 1 | 0 | -1 | -2 | -3 | -4 | -5 |
|   | 2 | 1 | 0 | -1 | -2 | -3 | -4 | -5 | -6 |
|   | 1 | 0 | -1 | -2 | -3 | -4 | -5 | -6 | -7 |
|   |   | 1 | 2 | 3 | 4 | 5 | 6 | 7 | 8 |

→ RNO REFERENCE STROBE NUMBER

*FIG. 16A*

|   | 8 | F | F | F | F | F | P | P | P |
|---|---|---|---|---|---|---|---|---|---|
|   | 7 | F | F | F | F | P | P | P | P |
|   | 6 | F | F | F | P | P | P | P | P |
| DNO ↑ DATA STROBE NUMBER | 5 | F | F | P | P | P | P | P | F |
|   | 4 | F | P | P | P | P | P | F | F |
|   | 3 | P | P | P | P | P | F | F | F |
|   | 2 | P | P | P | P | F | F | F | F |
|   | 1 | P | P | P | F | F | F | F | F |
|   |   | 1 | 2 | 3 | 4 | 5 | 6 | 7 | 8 |

→ RNO REFERENCE STROBE NUMBER

*FIG. 16B*

| | 0 | 00000 | 00001 | 00010 | 00011 | 00100 | 00101 | 00110 | 00111 | 01000 | 01001 | 01010 | 01011 | 01100 | 01101 | 01110 | 01111 | 10000 | 10001 |
|---|---|---|---|---|---|---|---|---|---|---|---|---|---|---|---|---|---|---|---|
| D00 | 0 | 1 | 0 | 0 | 0 | 0 | 0 | 0 | 0 | 0 | 0 | 0 | 0 | 0 | 0 | 0 | 0 | 0 | 0 |
| D01 | 0 | x | 1 | 0 | 0 | 0 | 0 | 0 | 0 | 0 | 0 | 0 | 0 | 0 | 0 | 0 | 0 | 0 | 0 |
| D02 | 0 | x | x | 1 | 0 | 0 | 0 | 0 | 0 | 0 | 0 | 0 | 0 | 0 | 0 | 0 | 0 | 0 | 0 |
| D03 | 0 | x | x | x | 1 | 0 | 0 | 0 | 0 | 0 | 0 | 0 | 0 | 0 | 0 | 0 | 0 | 0 | 0 |
| D04 | 0 | x | x | x | x | 1 | 0 | 0 | 0 | 0 | 0 | 0 | 0 | 0 | 0 | 0 | 0 | 0 | 0 |
| D05 | 0 | x | x | x | x | x | 1 | 0 | 0 | 0 | 0 | 0 | 0 | 0 | 0 | 0 | 0 | 0 | 0 |
| D06 | 0 | x | x | x | x | x | x | 1 | 0 | 0 | 0 | 0 | 0 | 0 | 0 | 0 | 0 | 0 | 0 |
| D07 | 0 | x | x | x | x | x | x | x | 1 | 0 | 0 | 0 | 0 | 0 | 0 | 0 | 0 | 0 | 0 |
| D08 | 0 | x | x | x | x | x | x | x | x | 1 | 0 | 0 | 0 | 0 | 0 | 0 | 0 | 0 | 0 |
| D09 | 0 | x | x | x | x | x | x | x | x | x | 1 | 0 | 0 | 0 | 0 | 0 | 0 | 0 | 0 |
| D10 | 0 | x | x | x | x | x | x | x | x | x | x | 1 | 0 | 0 | 0 | 0 | 0 | 0 | 0 |
| D11 | 0 | x | x | x | x | x | x | x | x | x | x | x | 1 | 0 | 0 | 0 | 0 | 0 | 0 |
| D12 | 0 | x | x | x | x | x | x | x | x | x | x | x | x | 1 | 0 | 0 | 0 | 0 | 0 |
| D13 | 0 | x | x | x | x | x | x | x | x | x | x | x | x | x | 1 | 0 | 0 | 0 | 0 |
| D14 | 0 | x | x | x | x | x | x | x | x | x | x | x | x | x | x | 1 | 0 | 0 | 0 |
| D15 | 0 | x | x | x | x | x | x | x | x | x | x | x | x | x | x | x | 1 | 0 | 0 |
| D16 | 0 | x | x | x | x | x | x | x | x | x | x | x | x | x | x | x | x | 1 | 0 |

FIG. 20

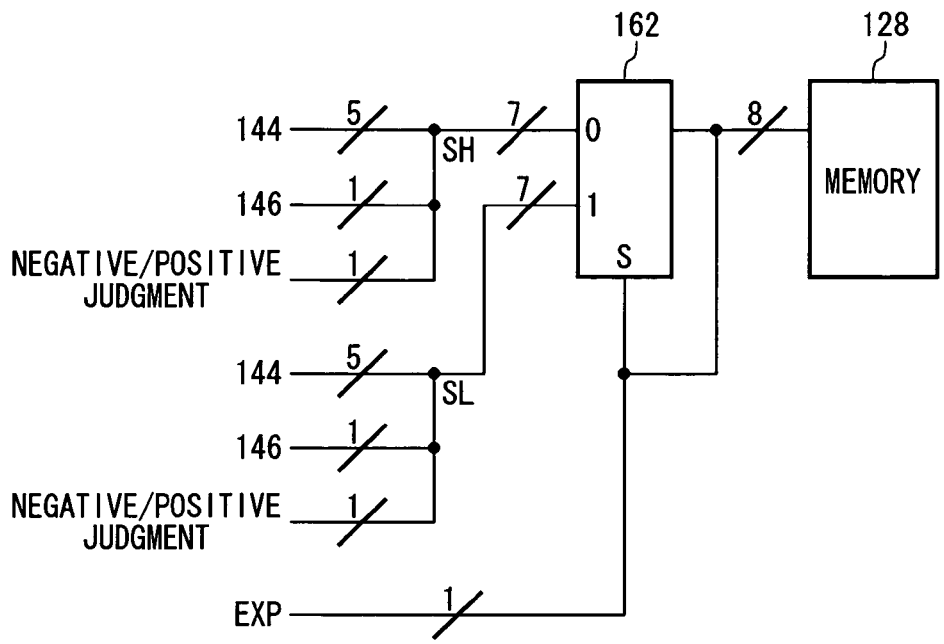

FIG. 22A

| D7 | D6 | D5 | D4 | D3 | D2 | D1 | D0 |
|---|---|---|---|---|---|---|---|
| EXP | GLITCH DETECTION | NEGATIVE/POSITIVE JUDGMENT | \multicolumn{5}{c}{CHANGING POINT CODE} | | | | |

D0~D4 : CHANGING POINT CODE
　　#0 NONE OF CHANGING POINT
　　#1~#F CHANGING POINT WAS DETECTED
　　　　　AT PHASE OF CHANGING POINT (VALUE-1) × 50PS
D5　　: NEGATIVE/POSITIVE JUDGMENT
　　　　FALLING OF SH/SL WAS DETECTED IN CASE OF 1
　　　　RISING OF SH/SL WAS DETECTED IN CASE OF 0
D6　　: GLITCH DETECTION
　　　　GLITCH WAS DETECTED IN CASE OF 1
　　　　GLITCH WAS NOT DETECTED IN CASE OF 0
D7　　: EXP
　　　　FH IS MEMORIZED IN "H-LEVEL" EXPECTATION IN CASE OF 1
　　　　FL IS MEMORIZED IN "L-LEVEL" EXPECTATION IN CASE OF 0

FIG. 22B

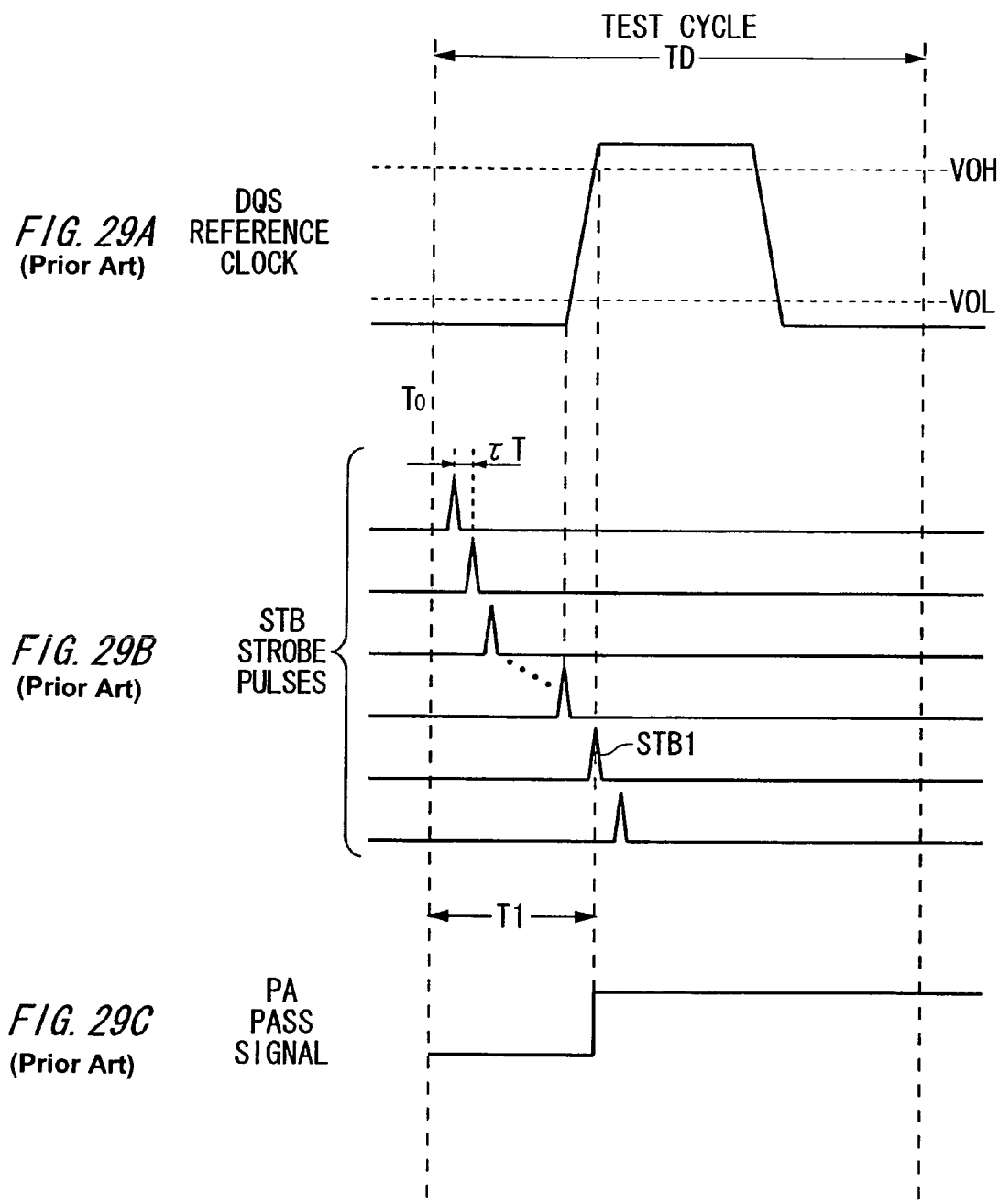

APPARATUS AND METHOD FOR TESTING SEMICONDUCTOR DEVICE

The present application is a continuation application of PCT/JP02/05924 filed on Jun. 13, 2002 which claims priority from Japanese patent application No. 2001-179106 filed on Jun. 13, 2001, the contents of which are incorporated herein by reference.

BACKGROUND OF THE INVENTION

1. Field of the Invention

The present invention relates to a method for testing a semiconductor device, which is suitable for testing a semiconductor device equipped with a memory capable of reading and writing at high speed, and an apparatus for testing a semiconductor device that operates using the testing method.

2. Related Art

The brief summary of an apparatus for testing a semiconductor device to test a general semiconductor device will be described for confirmation before the prior art relating to the present invention is described. FIG. 25 shows a configuration of a conventional apparatus for testing a semiconductor device. TES in FIG. 25 represents the overall apparatus for testing a semiconductor device. The apparatus for testing a semiconductor device TES consists of a main controller 13, a pattern generator 14, a timing generator 15, a waveform formatter 16, a logic comparator 12, a driver 17, a signal reading circuit 11, a bad analysis memory 18, a logical amplitude reference voltage source 19, a comparison reference voltage source 21 and a device source 22 etc.

The main controller 13, which is generally configured by a computer system, mainly controls the pattern generator 14 and the timing generator 15 in accordance with a test program prepared by a user, allows the pattern generator 14 to generate the test pattern data, changes the test pattern data into the test pattern signals having actual waveforms with the waveform formatter 16 and applies the test pattern signals to a semiconductor device to be tested DUT in order to store it via the driver 17 which amplifies the voltages of the waveforms having amplitude values set by the logical amplitude reference voltage source 19.

The signal reading circuit 11 reads out logical values from the response signals read from the semiconductor device to be tested DUT. The logic comparator 12 compares the logical values read out by the signal reading circuit 11 with the expected values outputted by the pattern generator 14, judges that there is a defect in the memory cell of the address when a non-coincidence occurs, stores the fail address into the bad analysis memory 18 for every fail occurrence, and judges, for example, whether the fail cell can be repaired after the test.

Although FIG. 25 shows a configuration of the test apparatus for one pin, practically, this configuration is provided for a plurality of pins of the semiconductor device to be tested DUT, and the input of the test patterns and the reading of the response signals from the semiconductor device to be tested DUT are conducted for every pin. These are the configurations of the apparatus for testing a semiconductor device for the general semiconductor device.

Meanwhile, in the semiconductor device such as a memory configured with a semiconductor device, there is a memory which performs data passing by using the timing of the clock, writing data into the semiconductor device synchronized with the clock by inputting the data together with the clock, while retrieving the data from the semiconductor device synchronized with the clock together with the clock.

FIG. 26 shows a state of reading of this kind of memory. DA, DB, DC . . . in FIG. 26A represent the data outputted by the semiconductor device (the data outputted from one of the pins). DQS shown in FIG. 26B the clock outputted from the memory. The data DA, DB, DC . . . is outputted from the semiconductor device synchronized with the clock DQS. This clock is used as a synchronization signal (data strobe) when passing the data DA, DB, DC . . . to other circuits.

As a test item when testing this kind of semiconductor device, there is an item to measure a time difference (phase difference) dI1, dI2, dI3 . . . from the timing at rising or falling of each of the clocks DQS (hereinafter, the clock is referred to as reference clock) to the transition point of the data. As the time difference dI1, dI2, dI3 . . . is short as possible it is evaluated as a device having an excellent characteristic that the response is fast. The grade of the semiconductor device to be tested is decided by the length of the time difference.

In regard to the reference clock DQS outputted from the semiconductor device to be tested, the clock generated by the clock source in applied to the semiconductor device, the clock is distributed to the circuits in the semiconductor device, and the data is outputted synchronized with the clock. Therefore, even when performing test with the apparatus for testing a semiconductor device, the clock from the apparatus for testing a semiconductor device is applied to the semiconductor device to be tested, the clock is outputted with the data as the reference clock for data delivery through the inside of the semiconductor device to be tested. Accordingly, the timing of rising or falling of the reference clock is measured and the time dI1, dI2, dI3 . . . from the timing of rising or falling measured to the transition point of the data DA, DB, DC . . . is measured.

As described above, since the reference clock outputted from the semiconductor device is outputted through the inside of the semiconductor device, the timing of rising and the timing of falling is considerably affected by the inside of the semiconductor device and the external environment such as temperature, so we can find a phenomenon that differences between the phases of the reference clocks DQS1, DQS2, DQS3 . . . occur for every semiconductor device as shown in FIG. 27. Further, added to that the phase difference is caused by the difference of each semiconductor device, we can find a phenomenon that jitter occurs, where in the phase difference is changed by the difference of the address of the memory accessed and the time transition (thermal change) even in the semiconductor device.

Therefore, in order to exactly measure the time dI1, dI2, dI3 . . . from the timing of rising or the timing of falling of the reference clock DQS to the transition point of the data DA, DB, DC . . . , it is necessary to exactly measure the timing of rising or the timing of falling of the reference clock DQS outputted from the semiconductor device in advance. Accordingly, the prior art gradually shifts the timing of applying the strobe of a signal reading circuit, with which the apparatus for testing a semiconductor device is equipped, measures the timing of rising or falling of the reference clock DQS, and measures the time dI1, dI2, dI3 . . . using the measurement result.

FIG. 28 shows a part for measuring the timing of rising or falling of the reference clock DQS being used in the prior art. The level comparator 10 is configured with a pair of voltage comparators CP1 and CP2, and judges whether or not the logical value of the reference clock DQS outputted by the semiconductor device to be tested DUT satisfies the normal voltage condition by a pair of voltage comparators CP1 and CP2. The voltage comparator CP1 judges whether or not the voltage value of the H logic of the reference clock DQS is more than the normal voltage value VOH. The voltage comparator CP2 judges whether or not the voltage value of the L logic of the reference clock DQS is less than the normal voltage value VOL.

These judgment results are inputted into the signal reading circuit 11, and the signal reading circuit 11 measures the timing of rising or the timing of falling of the reference clock DQS. The signal reading circuit 11 reads the logical value inputted at every timing of applying the strobe STB.

FIG. 29 shows an example of phases of the strobes in regard to DQS. The strobes STB are applied while being given phase differences ($\tau T$) by a small amount for each test cycle as shown in FIG. 29. That is, the strobes STB are given to the signal reading circuit 11 by one for each test cycle, and the state of the output of the voltage comparators CP1 and CP2 is read.

The logic comparator 12 compares the logical value outputted by the signal reading circuit 11 and the expected value, which is predetermined (the H logic as an example in FIG. 28), and outputs the pass signal PA, which indicates a pass (good), if the logical value outputted by the signal reading circuit 11 coincides with the expected value. The timing of the rising of the reference clock DQS is decided by obtaining the time T1 (FIG. 29C) from the occurrence timing of the strobe STB1 (FIG. 29B) when the output of the level comparator 10 is read to be reversed in the H logic (the occurrence timing of the strobes STB has already been known).

In case of detecting the timing of falling of the reference clock DQS, the timing of falling is detected by the strobe when the output of the voltage comparator CP2 is read to be reversed in the H logic like the detection of rising, while the strobe STB occurs at a timing after the timing of rising of the reference clock DQS in the H logic.

As described above, since the prior art measures the occurrence timing of the reference clock DQS by the timing measurement method using the signal reading circuit 11, with which the apparatus for testing a semiconductor device is equipped, and the strobe STB, which is applied to the signal reading circuit 11, there is a defect that it takes time to necessarily perform the test cycle TD many times repeatedly even when measuring only the timing of rising or falling of the reference clock DQS.

Furthermore, since the method of measuring the timing of rising or falling of the reference clock DQS have to measure all of the addresses of the memory to be tested or to measure all the way from the start to the end of the test pattern in case of avoiding the influence of the jitter caused by the heat, it is necessary to take long time to measure the timing of rising or falling of the reference clock. Although it is considered that the phase difference $\tau T$, which is given to the strobe STB, is adopted roughly so as to reduce the number of times of performing the test cycle as a method of decreasing the time taken in measuring the timing of rising or falling of the reference clock DQS, there is a defect that the reliability of the measurement result of the time dI1, dI2, dI3 . . . until the transition point the reference clock DQS and the data DA, DB, DC . . . is decreased because the accuracy of measuring the timing of rising or falling of the reference clock DQS is decreased if the phase difference $\tau T$, which is given to the strobe STB, is changed roughly.

SUMMARY OF THE INVENTION

Therefore, it is an object of the present invention to provide an apparatus and a method for testing a semiconductor device, which are capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, an apparatus for testing a semiconductor device based on output data of the semiconductor device, comprises a multi-strobe generator for generating a multi-strobe having a plurality of strobes, of which phases are different by a small amount, an output data transition point detector for detecting a timing of rising or falling of a wave form of the output data based on the multi-strobe, a reference clock transition point detector for detecting a timing of rising or falling of a reference clock outputted by the semiconductor device accompanying the output data, wherein the reference clock is a signal to set a timing of passing the output data, based on the multi-strobe and a judging unit for judging quality of the semiconductor device based on the timing of rising or falling of a waveform of the output data detected by the output data transition point detector and the timing of rising or falling of a waveform of the reference clock detected by the reference clock transition point detector.

The judging unit may judge the quality of the semiconductor device based on whether or not a phase difference between the timing of rising or falling of a waveform of the output data detected by the output data transition point detector and the timing of rising or falling of a wave form of the reference clock detected by the reference clock transition point detector is within a predetermined range.

The multi-strobe generator may generate a first multi-strobe in order to detect a transition point of a value of the output data and a second multi-strobe in order to detect a transition point of a value of the reference clock.

The apparatus for testing a semiconductor device may further comprise a level comparator for changing the output data and the reference clock into digital data represented by H logic or L logic, wherein the output data transition point detector may detect a value of the output data changed into the digital data in regard to a phase of each of strobes of the first multi-strobe, and if a value of the output data in regard to a phase of a first strobe of the first multi-strobe and a value of the output data in regard to a phase of a second strobe adjacent to the first strobe are different then may determines the phase of the first strobe as the transition point of the value of the output data, the reference clock transition point detector may detect a value of the reference clock changed into the digital data in regard to a phase of each of strobes of the second multi-strobe, and if a value of the reference clock in regard to a phase of a third strobe of the second multi-strobe and a value of the reference clock in regard to a phase of a fourth strobe adjacent to the third strobe are different then may determines the phase of the third strobe as the transition point of the value of the reference clock and the judging unit may judge the quality of the semiconductor device based on the transition point of the value of the output data and the transition point of the value of the reference clock.

The judging unit may judge the quality of the semiconductor device based on whether or not a difference between a strobe number of the first multi-strobe indicating which timing of a strobe of the first multi-strobe the output data transition point detector detects the transition point of a value of the output data and a strobe number of the second multi-strobe indicating which timing of a strobe of the second multi-strobe the reference clock transition point detector detects the transition point of a value of the reference clock at is within a predetermined range.

The judging unit may comprise a memory for storing a reference table to set the quality of the semiconductor device about a combination of the strobe number of the first multi-strobe, in which the transition point of a value of the output data is detected and the strobe number of the second multi-strobe, in which the transition point of a value of the reference clock is detected, and judge the quality of the semiconductor device based on the reference table.

The output data transition point detector may comprise a means for detecting whether a value of digital data in regard to the transition point of a value of the output data changes from the H logic to the L logic or changes from the L logic to the H logic.

The output data transition point detector may take a transition point of an earliest phase or a transition point of a latest phase as the transition point of a value of the output data if a plurality of the transition points of a value of the output data is detected.

The apparatus for testing a semiconductor device may further comprise a glitch detector for detecting existence of a glitch in regard to the output data based on the timing of rising or falling of a waveform of the output data detected by the output data transition point detector.

The judging unit may judge the quality of the semiconductor device further based on existence of the glitch detected by the glitch detector.

The glitch detector may detect existence of a glitch in regard to the output data based on the transition point of a value of the output data.

The glitch detector may judge whether there is the glitch of the output data or not if the transition points of a value of the output data are more than or equal to two.

The multi-strobe generator may comprise a plurality of delay devices connected in cascade, supplies a strobe to each of the plurality of delay devices connected in cascade and generates the multi-strobe based on strobes delayed respectively and outputted by the plurality of delay devices.

According to the second aspect of the present invention, an apparatus for testing a semiconductor device based on output data of the semiconductor device, comprises a first multi-strobe generator for generating a first multi-strobe having a plurality of strobes, of which phases are different by a small amount in regard to the output data, a reference phase measuring unit for measuring an output timing, which is a signal to set a timing of passing the output data, being a timing of rising or falling of a waveform of a reference clock outputted by the semiconductor device accompanying the output data, a reference phase memory for memorizing the output timing, a transition point detector for detecting a transition point of a value of the output data based on the first multi-strobe, a phase difference measuring unit for measuring a phase difference between the output timing and the transition point of a value of the output data and a judging unit for judging the quality of the semiconductor device based on the phase difference.

The first multi-strobe generator may comprise a plurality of delay devices connected in cascade, supplies a strobe to the plurality of delay devices connected in cascade, and generates the first multi-strobe based on strobes delayed respectively and outputted by the plurality of delay devices.

The transition point detector may comprise a means for changing the output data into digital data represented by H logic or L logic, and the transition point detector may detect a value of the output data in regard to a phase of each of strobes of the first multi-strobe, and if a value of digital data in regard to a phase of a first strobe of the first multi-strobe and a value of digital data in regard to a phase of a second strobe adjacent to the first strobe are different then may determine the phase of the first strobe as the transition point of the value of the output data.

The transition point detector may comprise a means for detecting whether the value of digital data in regard to the transition point changes from the H logic to the L logic or changes from the L logic to the H logic.

The transition point detector may take a transition point of an earliest phase or a transition point of a latest phase as the transition point of a value of the output data if a plurality of the transition points of a value of the output data is detected.

The reference phase measuring unit may comprise a means for generating a second multi-strobe having a plurality of strobes, of which phases are different by a small amount, in regard to the reference clock, a means for detecting the transition point of a value of the reference clock based on the second multi-strobe and a means for calculating the output timing of the reference clock based on a strobe number of the second multi-strobe, in which the transition point of a value of the reference clock is detected.

The reference phase memory may store the strobe number of the second multi-strobe, in which the transition point of a value of the reference clock is detected.

The first multi-strobe generator may set a phase of the first multi-strobe based on the strobe number of the second multi-strobe stored by the reference phase memory.

The apparatus for testing a semiconductor device may further comprise a glitch detector for detecting existence of a glitch in regard to the transition point of a value of the output data.

The judging unit may judge the quality of the semiconductor device further based on existence of the glitch detected by the glitch detector.

The glitch detector may judge whether there is the glitch of the output data or not if the transition points of a value of the output data detected by the transition point detector are more than or equal to two.

According to the third aspect of the present invention, a method for testing a semiconductor device based on output data of the semiconductor device, comprises a first multi-strobe generating step of generating a first multi-strobe having a plurality of strobes, of which phases are different by a small amount, in regard to the output data, an output data transition point detecting step of detecting a timing of rising or falling of a waveform of the output data based on the first multi-strobe, a second multi-strobe generating step of generating a second multi-strobe having a plurality of strobes, of which phases are different by a small amount, in regard to a reference clock, which is a signal to set a timing of passing the output data, the reference clock being outputted by the semiconductor device accompanying the output data, a reference clock transition point detecting step of detecting a timing of rising or falling of a waveform of the reference clock based on the second multi-strobe and a judging step of judging the quality of the semiconductor device based on the timing of rising or falling of a waveform of the output data detected in the output data transition point detecting step and the timing of rising or falling of a waveform of the reference clock detected in the reference clock transition point detecting step.

The method for testing a semiconductor device may further comprise a glitch detecting step of detecting existence of a glitch in regard to the output data based on the transition point of a value of the output data, wherein the judging step may judge the quality of the semiconductor device further based on existence of the glitch detected in the glitch detecting step.

According to the fourth aspect of the present invention, a method for testing a semiconductor device based on output data of the semiconductor device, comprises a reference phase measurement step of measuring an output timing of a reference clock, which is a signal to set a timing of passing the output data, the reference clock being outputted by the semiconductor device accompanying the output data, a reference phase memorizing step of memorizing the output timing, a first multi-strobe generating step of generating a first multi-strobe having a plurality of strobes, of which phases are different by a small amount, in regard to the output data, an output data transition point detecting step of detecting the transition point of a value of the output data based on the first multi-strobe, a phase difference measuring step of measuring a phase difference between the output timing and the transition point of a value of the output data and a judging step of judging the quality of the semiconductor device based on the phase difference.

The method for testing a semiconductor device may further comprise a glitch detecting step of detecting existence of a glitch in regard to the output data based on the transition point of a value of the output data.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 3A, 3B and 3C are graphs showings an example of second multi-strobe generated by a second multi-strobe generator 30.

FIGS. 4A, 4B and 4C are graphs showing another example of a second multi-strobe generated by a second multi-strobe generator 30.

FIGS. 16A and 16B show an example of a reference table stored by a memory 80.

FIG. 20 shows an example of the digital signals received by the priority encoder 144 shown in FIG. 19 and the digital signals outputted.

FIGS. 22A and 22B show an example of the process and data configuration of the data stored by a memory 128.

FIGS. 29A, 29B and 29C are timing chart showing an example of phases of strobes in regard to DQS.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
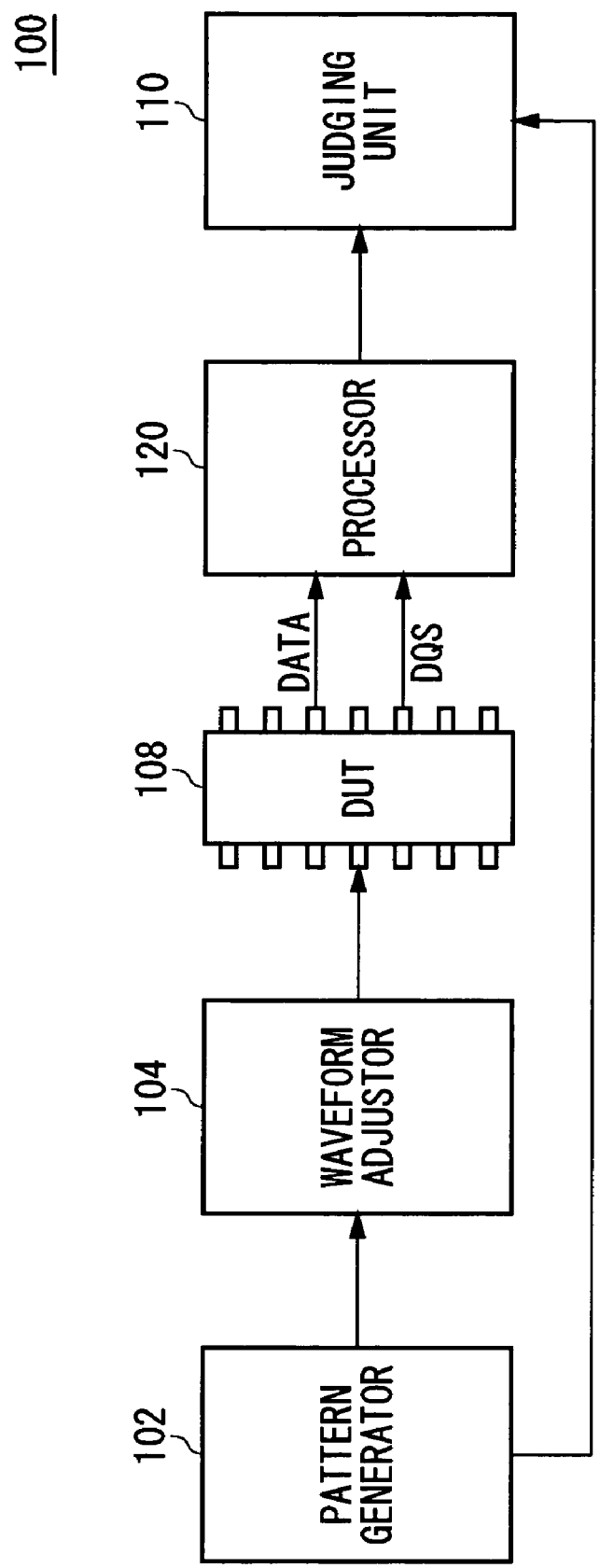
FIG. 1 shows an example of the configuration of an apparatus for testing a semiconductor device 100.

FIG. 1 shows an example of the configuration of an apparatus for testing a semiconductor device 100. The apparatus for testing a semiconductor device 100 has a pattern generator 102 for generating test patterns in order to test a semiconductor device (DUT) 108, a waveform adjuster 104 for adjusting the test patterns and supplying them to the semiconductor device 108, a processor 120 for processing the output data outputted by the semiconductor device 108 based on the test patterns, a judging unit 110 for judging the quality of the semiconductor device 108 based on the output data processed by the processor 120 and expected signals generated the pattern generator 102 based on the test patterns.

The pattern generator 102 generates the test patterns based on, for example, a test program generated by a user, and supplies it to the waveform adjuster 104. In addition, the pattern generator 102 generates the expected signals, which the semiconductor device 108 is expected to output when receiving the test patterns, based on the test patterns that are generated. The waveform adjuster 104 adjusts the test patterns received, and supplies them to the semiconductor device 108. For example, the waveform adjuster 104 delays the test patterns based on a test program generated by a user, and supplies the test patterns them to the semiconductor device 108 at a predetermined timing.

The processor 120 receives the output data outputted by the semiconductor device 108 based on the test patterns inputted and the reference clock (DQS), which is a signal to set the timing of passing the output data and is outputted by the semiconductor device 108 accompanying the output data, then performs a predetermined process on the signals, and supplies them to the judging unit 110. The judging unit 110 judges the quality of the semiconductor device 108 based on the signals received from the processor 120 and the expected signals received from the pattern generator 102. For example, the judging unit 110 judges the semiconductor device 108 as the good quality if the signals received from the pattern generator 102 coincide with the expected signals received from the pattern generator 102. Hereinafter, the configuration and operation of the processor 120 and the judging unit 110 will now be described in detail.

Figure 2:
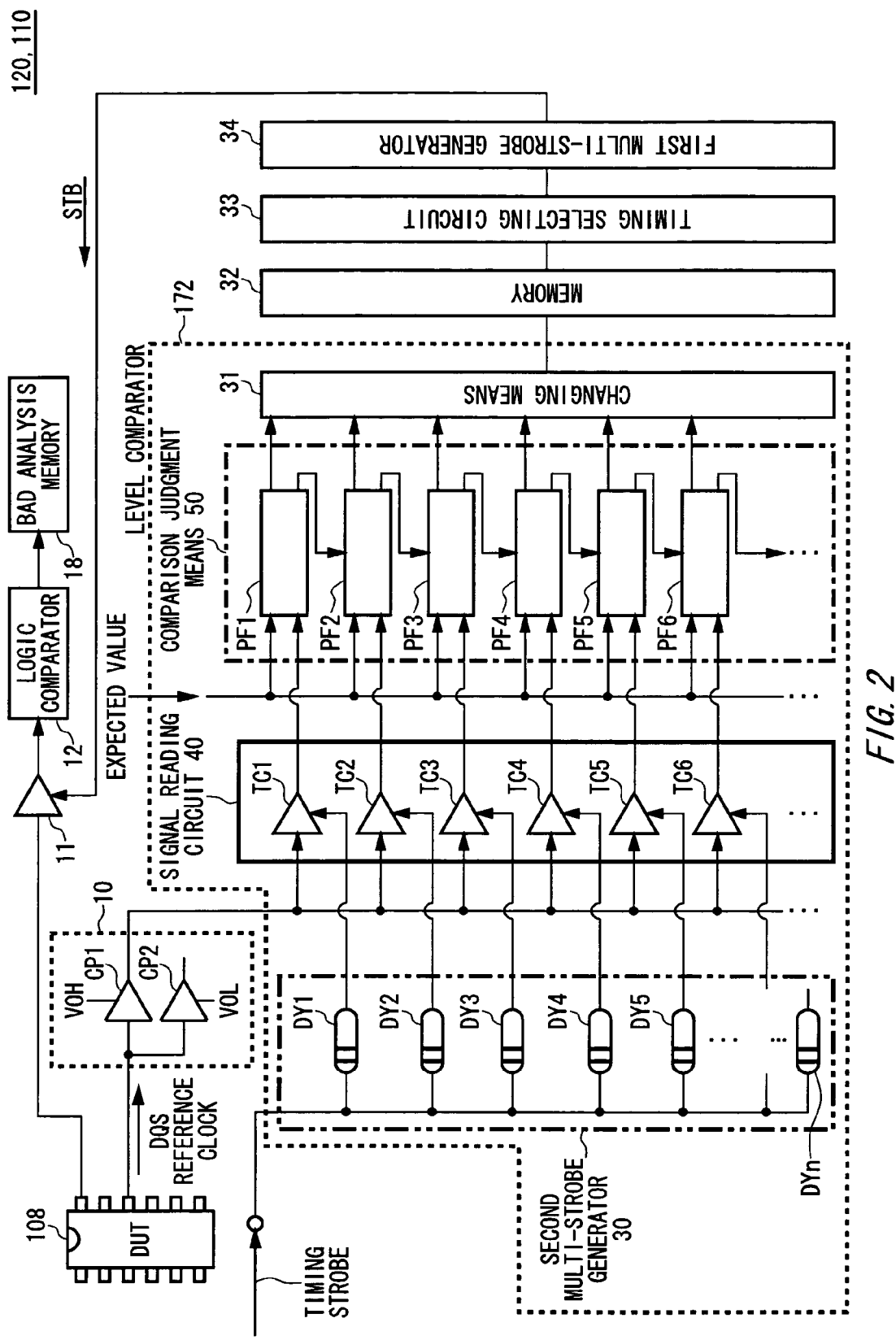
FIG. 2 shows an example of the detailed configurations of a processor 120 and a judging unit 110 of an apparatus for testing a semiconductor device 100.

FIG. 2 shows an example of the detailed configurations of the processor 120 and the judging unit 110 of the apparatus for testing a semiconductor device 100. The processor 120 has, for example, a level comparator 10, a reference phase measuring unit 172 and a reference phase memory, for a pin outputting the reference clock DQS. The reference phase measuring unit 172 has a second multi-strobe generator 30, a plurality of signal reading circuit 40, a comparison judging means 50 and a changing means 31 for changing the judgment results of the comparison judging means 50 into the strobe number of the multi-strobe. The reference phase measuring unit 172 measures the output timing of the reference clock DQS outputted by the semiconductor device 108 accompanying the output data as a signal to set the timing of passing the output data. In the present embodiment, the second multi-strobe generator 30 has a plurality of delay devices DY1, DY2, DY3, DY4, DY5 . . . , DYN (Here, N is an integer.) in which delay times are set to be different by a small amount. The second multi-strobe generator 30 supplies the timing strobe to each of the plurality of delay devices, and generates the second multi-strobe based on the timing strobe delayed and outputted by each of the plurality of delay devices. The timing strobe maybe, for example, a pulse signal. The second multi-strobe generator 30 generates the second multi-strobe having a plurality of strobes, of which the phases are different by a small amount, for the reference clock DQS. It is possible to generate the second multi-strobe having a time difference of 100 PS (Pico Second) by giving a time difference, for example, of 100 PS to the delay time of each of the delay devices DY1, DY2, DY3, DY4, DY5 . . . and DYN. The multi-strobe generator 30 may have a plurality of delay devices connected in cascade like a first multi-strobe generator 154 (cf., FIG. 18) described below.

The signal reading circuit 40 and the comparison judging means 50 detect the transition point of the value of the reference clock DQS based on the second multi-strobe generated by the second multi-strobe generator 30. The changing means 31 supplies the strobe number indicating which strobe of the second multi-strobe the transition point of the value of the reference clock DQS is detected at to the memory 32, wherein the transition point of the value of the reference clock DQS is detected. For example, a plurality of strobes, of which the second multi-strobe consists, is given numbers in ascending order from the strobe having an earlier phase, and the changing means 31 supplies the memory 32 with the number of the strobe, wherein the transition point of the value of the reference clock DQS is detected. The reference phase measuring unit 172 may calculate the output timing of the reference clock DQS based on the strobe number of the second multi-strobe, wherein the transition point of the value of the reference clock DQS is detected.

The reference phase memory, which maybe the memory 32 in FIG. 2, stores the output timing of the reference clock DQS measured by the reference phase measuring unit 172. In the present embodiment, the memory 32 stores the strobe number changed by the changing means 31 as the output timing of the reference clock DQS. That is, the memory 32, which is a reference phase memory, stores the strobe number of the second multi-strobe, wherein the transition point of the value of the reference clock DQS is detected.

Figure 28:
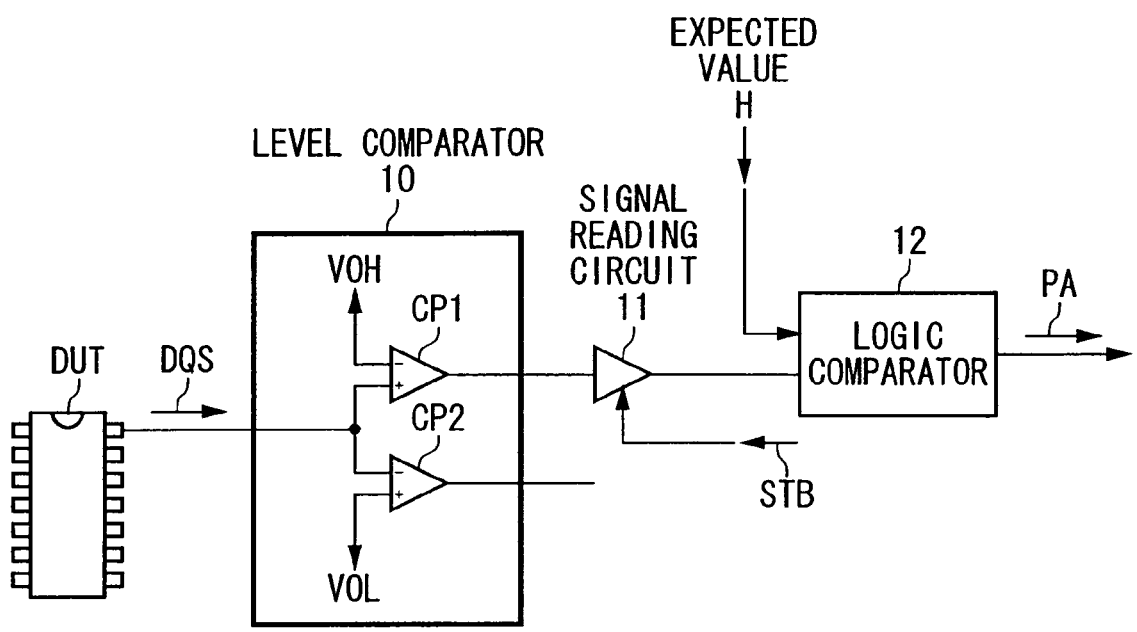
FIG. 28 shows a part for measuring the timing of rising or falling of a reference clock DQS used in the prior art.
Figure 25:
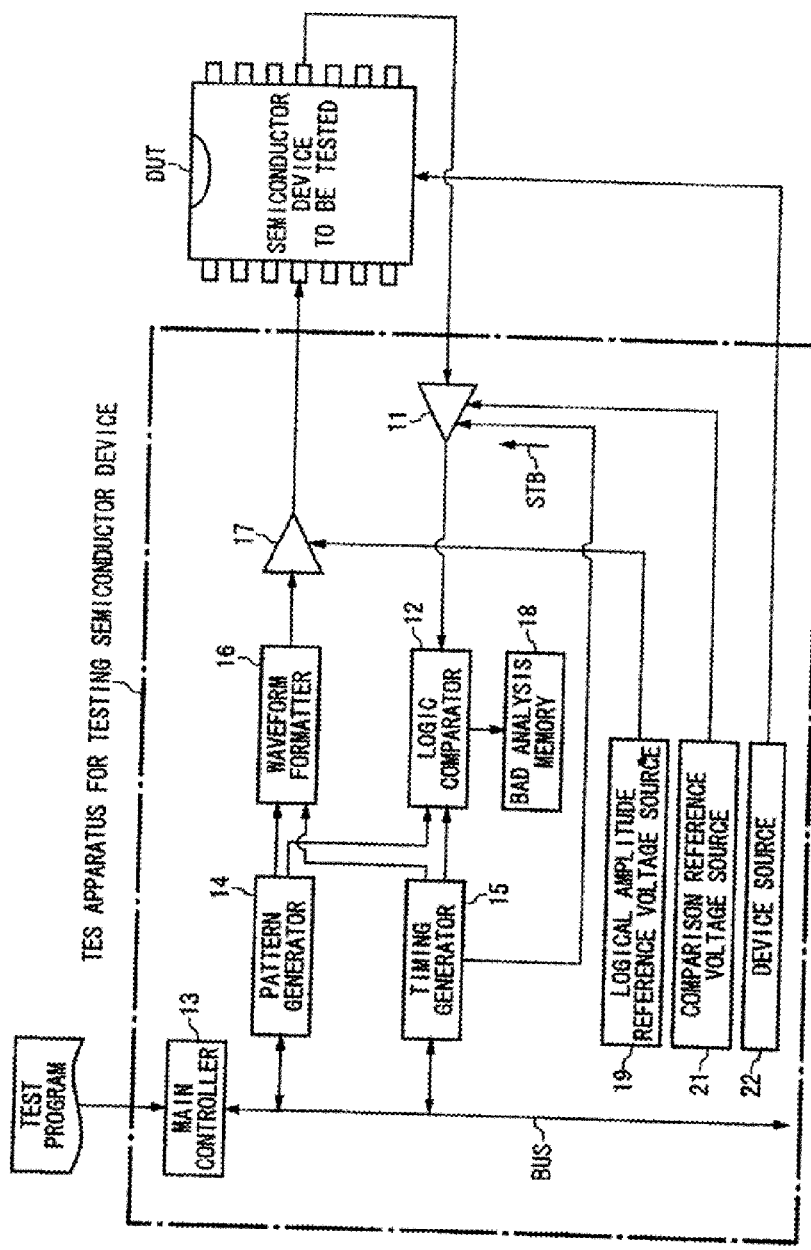

In addition, the processor 120 further has the timing selecting circuit 33 and the first multi-strobe generator 34. The timing selecting circuit 33 selects and outputs the occurrence timing of the first multi-strobe STB generated by the first multi-strobe generator 34 from the strobe numbers read from the memory 32 during the test. The first multi-strobe generator 34 generates the first multi-strobe STB at the timing selected in the timing selecting circuit 33. In the present embodiment, the first multi-strobe generator 34 has the same function and configuration as those of the second multi-strobe generator 30. In addition, the judging unit 110 has, for example, a signal reading circuit 11, a logic comparator 12 and a bad analysis memory 18. The signal reading circuit 11 and the logic comparator 12 have the same functions and configurations as those of the signal reading circuit 11 and the logic comparator 12 described in regard to FIG. 28. The signal reading circuit 11 detects the values of the output signals of the semiconductor device 108 at the timing of each of the first multi-strobe STB. The logic comparator 12 compares the values of the output signals detected by the signal reading circuit 11 and the expected values. The bad analysis memory 18 stores the results from comparing the output signals and the expected values by the logic comparator 12. The pattern generator 102 described in regard to FIG. 1 may supply the logic comparator 12 with the expected values based on the test patterns.

FIG. 3 shows an example of the second multi-strobe generated by the second multi-strobe generator 30. The second multi-strobe P1, P2, P3, P4 . . . , Pn (Here, n is an integer.), which is given the phase difference of, e.g., 100 PS each from a predetermined phase position of the test cycle TD, are given to the timing input terminal of each of the circuits TC1, TC2, TC3, TC4, TC5 . . . , TCn (Here, n is an integer.) of the signal reading circuit 40. In the present embodiment, the constant of the second multi-strobe will be given 6, that is, n=6 in the below description. In the present embodiment, the timing of rising of the reference clock DQS will be described for example.

Each of the circuits TC1 to TC6 of the signal reading circuit 40 receives the level comparison results from the level comparator 10 through each of the input terminals. In the present embodiment, each of the circuits TC1 to TC6 of the signal reading circuit 40 receives the output of the voltage comparator CP1, which performs the level comparison of the H logic in the level comparator 10, through each of the input terminals. The voltage comparator CP1 outputs the H logic if the voltage level of the reference clock DQS is higher than the reference voltage VOH, and outputs the L logic if the voltage level of the reference clock DQS is lower than the reference voltage VOH.

FIG. 3A shows an example of the waveform of the reference clock DQS outputted by the semiconductor device 108. The horizontal axis represents a time axis, and the vertical axis represents a voltage level in FIG. 3A. FIG. 3B shows an example of the timing of each of the second multi-strobe generated by the second multi-strobe generator 30. The horizontal axis represents the same time axis as that in FIG. 3A. Each of the circuits TC1 to TC6 of the signal reading circuit 40 detects the output of the voltage comparator CP1 in regard to the timing of strobe corresponding to the second multi-strobe respectively, and supplies the detection results to the comparison judging means 50.

The comparison judging means 50 has judging devices PF1 to PF6 corresponding to each of the circuits TC1 to TC6 of the signal reading circuit 40 respectively. The judging devices PF1 to PF6 compare each of the expected values (the H logic in the present embodiment) and the detection result of the corresponding circuit of the circuits TC1 to TC6 of the signal reading circuit 40. The judging devices PF1 to PF6 output the H logic indicating the coincidence, if the corresponding output of the circuits TC1 to TC6 and the expected value coincide with each other. In the present embodiment, the judging devices PF1 to PF6 compare each of the judgment results and the judgment result of the pre-stage judging device (the judging device in which the corresponding strobe number of the second multi-strobe is earlier by one), and output the H logic indicating that the transition point of the value of the reference clock DQS is detected, if the judgment result itself and the judgment result of the previous stage do not coincide. That is, the judging devices PF1 to PF6 output the H logic, if the transition point of the value of the reference clock DQS is detected at the corresponding timing of the second multi-strobe.

The comparison judging means 50 supplies the signals shown in FIG. 3C to the changing means 31 in regard to an example of the timing of the reference clock DQS and the second multi-strobe shown in FIG. 3A and FIG. 3B. That is, in the present embodiment, the comparison judging means 50 detects the transition point of the value of the reference clock DQS, namely, the rising of the waveform at the timing of strobe represented as P4 in FIG. 3B, and the judging device PF4, which corresponds to the strobe represented as P4, supplies the H logic to the changing means 31.

FIG. 4 shows another example of the second multi-strobe generated by the second multi-strobe generator 30. In the present embodiment, an example of measuring the timing of rising of the reference clock DQS will be described. FIG. 4A shows, like FIG. 3A, an example of the wave form of the reference clock DQS outputted by the semiconductor device 108. FIG. 4B shows, like FIG. 3B, an example of each of the timings of the second multi-strobe generated by the second multi-strobe generator 30.

Although the configuration for measuring the timing of falling of the waveform of the reference clock DQS is omitted in FIG. 2, the configuration in FIG. 2 is the same as that of measuring the timing of rising of the waveform of the reference clock DQS. That is, the processor 120 may have a reference phase measuring unit 172 for detecting the rising of the reference clock DQS and a reference phase measuring unit 172 for detecting the falling of the reference clock DQS. In addition, the processor 120 may have a reference phase measuring unit 172 for detecting the rising and falling of the reference clock DQS. In this case, each of the circuits of the signal reading circuit 40 and the judging devices of the comparison judging means 50 preferably have the configuration (cf. FIG. 5) described below.

Each of the circuits TC1 to TC6 of the signal reading circuit 40 of the reference phase measuring unit 172 for detecting the falling of the reference clock DQS detects the output of the voltage comparator CP2 at the respectively corresponding timing of the second multi-strobe, and supplies the detection results to the comparison judging means 50.

The comparison judging means 50 has judging devices PF1 to PF6 that respectively correspond to each of the circuits TC1 to TC6 of the signal reading circuit 40. The judging devices PF1 to PF6 compare each of the expected values (the L logic in the present embodiment) and the detection result of the corresponding circuit of the circuits TC1 to TC6 of the signal reading circuit 40. The judging devices PF1 to PF6 output the H logic indicating the coincidence if the corresponding output of the circuits TC1 to TC6 and the expected value coincide. In the present embodiment, the judging devices PF1 to PF6 compare each of the judgment results and the judgment result of the pre-stage judging device (the judging device in which the corresponding strobe number of the second multi-strobe is earlier by one), and output the H logic indicating that the transition point of the value of the reference clock DQS is detected, if the judgment result itself and the judgment result of the previous stage do not coincide. That is, the judging devices PF1 to PF6 output the H logic if the transition point of the value of the reference clock DQS is detected at the corresponding timing of the second multi-strobe.

The comparison judging means 50 supplies the signals shown in FIG. 4C to the changing means 31 in regard to an example of the timing of the reference clock DQS and the second multi-strobe shown in FIG. 4A and FIG. 4B. That is, in the present embodiment, the comparison judging means 50 detects the transition point of the value of the reference clock DQS, namely, the rising of the waveform at the timing of strobe represented as P4 in FIG. 4B, and the judging device PF4, which corresponds to the strobe represented as P4, supplies the H logic to the changing means 31.

Figure 5:
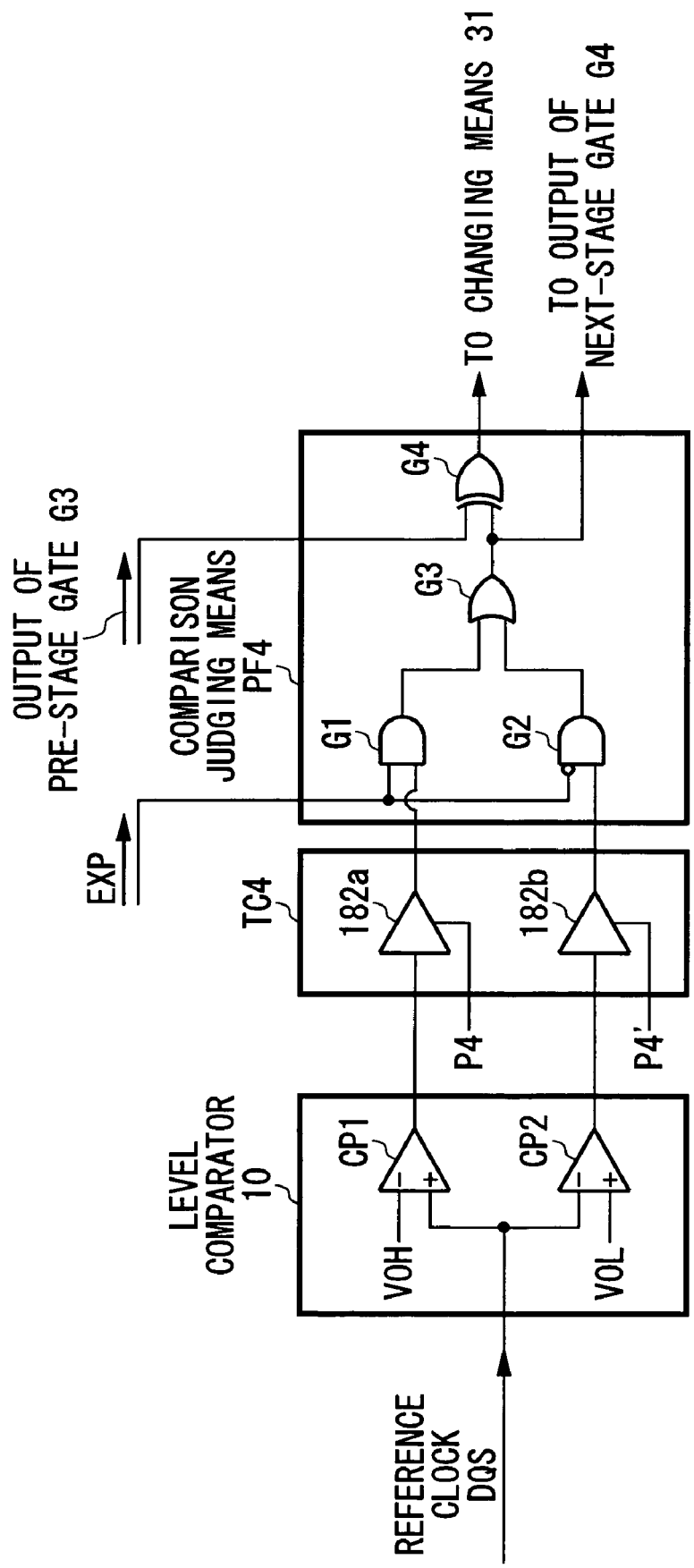
FIG. 5 shows an example of the configurations of a signal reading circuit 40 and a comparison judging means 50.

FIG. 5 shows an example of the configurations of the signal reading circuit 40 and the comparison judging means 50. In present embodiment, an example of the configurations of the circuit TC4 of the signal reading circuit 40 and the judging device PF4 of the comparison judging means 50 are shown. Each of the circuits TC1 to TCn of the signal reading circuit may have the same configuration as TC4 described in the present embodiment. Each of the judging devices PF1 to PFn of the comparison judging means 50 may have the same configuration as PF4 described in the present embodiment.

The circuit TC4 has a circuit 182a and a circuit 182b. The circuit 182a receives the signals outputted by the voltage comparator CP1 of the level comparator 10. In addition, the circuit 182b receives the signals outputted by the voltage comparator CP2 of the level comparator 10. In addition, the circuit 182a receives the strobe P4 of the second multi-strobe as, for example, shown in FIG. 3B, detects the output of the voltage comparator CP1 at the timing of the strobe P4, and supplies the detection results to the judging device PF4. In addition, the circuit 182b receives the strobe P4' of the second multi-strobe as, for example, shown in FIG. 4B, detects the output of the voltage comparator CP2 at the timing of the strobe P4', and supplies the detection results to the judging device PF4.

The judging device PF4 has the gates G1 to G4 as shown in FIG. 5. The gate G1 compares the expected value EXP and the output of the circuit 182a. The gate G1 maybe a logical multiply circuit for outputting the logical multiply of the output of the circuit 182a and the expected value EXP. In the present embodiment, the expected value EXP is given the H logic if the rising of the reference clock DQS is detected, and the expected value EXP is given the L logic if the falling of the reference clock DQS is detected. That is, by setting the expected value EXP to be the H logic, the gate G1 becomes effective, so the gate G1 watches whether the output of the circuit 182a is reversed from the L logic to H logic. The gate G2 compares the output of the circuit 182b and the expected value EXP. The gate G2 may be a logical multiply circuit for outputting the logical multiply of the output of the circuit 182b and the reverse signal of the expected value EXP.

In addition, the gate G3 outputs the logical sum of the outputs of the gates G1 and G2. The gate G4 detects the non-coincidence of the output of the gate G3 and the output of the gate G3 of the pre-stage judging device. In the present embodiment, the gate G4 of PF4 detects the non-coincidence of the output of the gate G3 of PF4 and the output of the gate G3 of PF3. It is possible to detect the timing of rising of the reference clock DQS through a route that passes the voltage comparator CP1, the circuit 182a, the gate G1, the gate G3 and the gate G4. In the same way, it is possible to detect the timing of falling of the reference clock DQS through a route that passes the voltage comparator CP2, the circuit 182b, the gate G2, the gate G3 and the gate G4. Hereinafter, the operation of the judging device PF4 when detecting the rising of the reference clock DQS will be described.

When the circuit 182a outputs the H logic, the gate G1 outputs the H logic. The H logic outputted by the gate G1 is supplied to the gate G4 via the gate G3. The gate G4 is, for example, an exclusive logical summation circuit, and an input terminal thereof is supplied with the output of the gate G3 of the pre-stage judging device PF3. If the output of the gate G3 of the pre-stage judging device PF3 is not the H logic and the output of the gate G4 of the judging device PF4 is the H logic, the gate G4 outputs the H logic. The output of the gate G4 is supplied to the changing means 31 shown in FIG. 2. And, the output of the gate G3 is supplied to the gate G4 of the next-stage judging device PF5. The circuit 182a in the next-stage circuit TC5 supplies the H logic to the judging device PF5, and the gate G3 of the judging device PF4 supplies the H logic to the judging device PF5. For this reason, the gate G4 of the judging device PF5 does not detects the non-coincidence, and the gate G4 of the judging device PF5 outputs the L logic indicating the coincidence.

As described above, only the judging device, which has first received the strobe, is designed to output the H logic from when the level of the reference clock DQS is more than the reference voltage VOH set for the level comparison. Further, in the present embodiment, the non-coincidence detection gate G4 of the first-stage judging device PF1 is given the L logic as the output of the pre-stage gate G3. Due to this, if the signal reading circuit TC1 outputs the H logic, the gate G4 of the judging device PF1 detects the non-coincidence of the H logic, and outputs the H logic indicating the non-coincidence. That is, the rising of the reference clock DQS is detected at the beginning of the test cycle TD. Although it has been described that the comparison judging means 50 detects the timing of rising of the reference clock, the comparison judging means 50 can detect the falling of the reference clock by the same operation even when detecting the falling of the reference clock.

The changing means 31 takes the comparison judgment result of each of the judging devices PF1, PF2, PF3, PF4, PF5 . . . , PFn, and changes it into the data having preferably small number of bits. For example, the changing means 31 receives the output of the judging devices PF1, PF2, PF3, PF4, PF5 . . . , PFn in the form of signal of n bits, and generates the digital signal indicating the number of the judging device, wherein the output is the H logic, based on the signals received. That is, the changing means 31 generates the digital signal that indicates the strobe number of the second multi-strobe, wherein the output of the corresponding judging device PF1 to PFn is the H logic. The digital signal generated by the changing means 31 represents the strobe number, wherein the transition point of the value of the reference clock DQS is detected.

Figure 6:
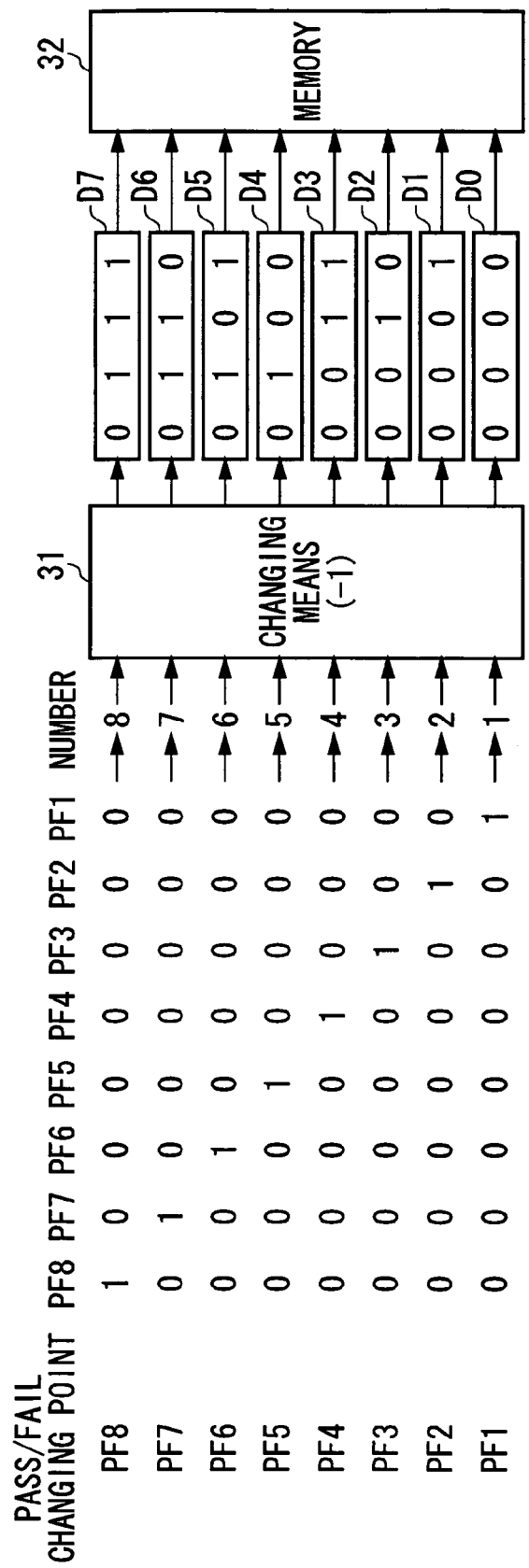
FIG. 6 shows an operation algorithm of a changing means 31.

FIG. 6 shows an operation algorithm of the changing means 31. It is desirable that the second multi-strobe has a strobe interval to satisfy the measurement accuracy enough for the spec of the semiconductor device 108. In addition, it is desirable that the signal reading circuit 40 and the comparison judging means 50 have the circuits TC1, TC2, . . . , TCn and the judging devices PF1, PF2, . . . , PFn, which respectively correspond to each of the second multi-strobe. In the present embodiment, it will be described that the comparison judging means 50 has eight judging devices PF1 to PF8.

First, any one of the eight judging devices PF1 to PF8 outputs the H logic (represented by 1 in the drawing). The changing means 31 receives the output signals of the judging devices PF1 to PF8 in the form of the signals of 8 bits. For example, as shown in FIG. 6, when the judging device PF7 detects the transition point of the value of the reference clock, the changing means 31 receives the digital signal that is represented by 01000000. The changing means 31 changes the bit position, which represents 1, into the numeral value of 1 to 8 for the digital signals received, and further subtracts [1] from the numeral value. For example, if the changing means 31 receives the digital signal that represents 01000000, it detects the number 7 as the bit position that represents 1, and calculates the number 6, which is the value from which 1 is subtracted.

Next, the changing means 31 changes the numeral value calculated into, for example, the numeral data of 4 bits D0 to D7. For example, if the changing means 31 calculates the number 6, it changes the number 6 into the numeral data D6 (0110). The numeral data of 4 bits F0 to F7 can be handled as the strobe number that represents the phase order of the multi-strobe P1 to P8. The changing means 31 stores the numeral data of 4 bits D0 to D7 that represents the strobe number into the memory 32. In this way, by changing the comparison judgment results of 8 bits into the strobe number data of 4 bits, it is possible to obtain the advantage to reduce the memory capacity of the memory 32.

Figure 7:
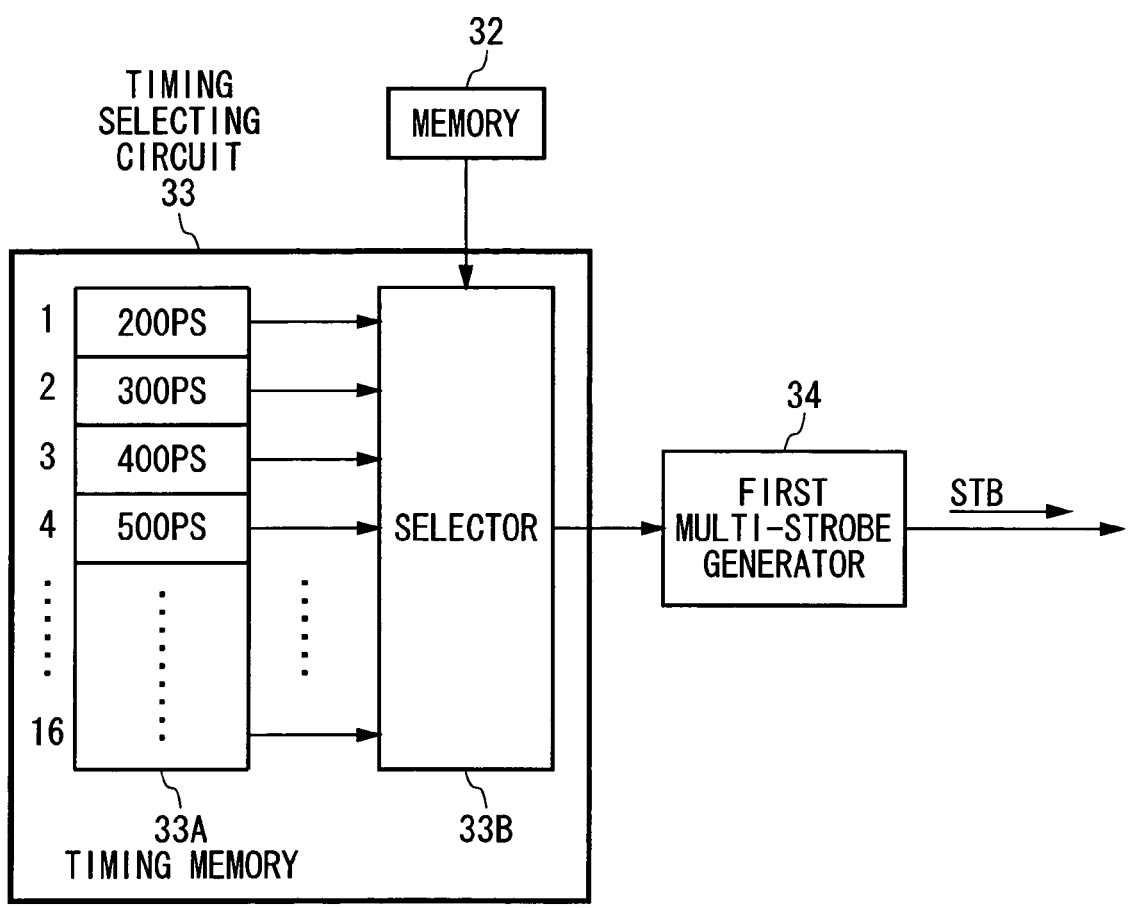
FIG. 7 shows an example of the configuration of a timing selecting circuit 33.

FIG. 7 shows an example of the configuration of the timing selecting circuit 33. In the present embodiment, the timing selecting circuit 33 has a timing memory 33A for storing the occurrence timing of the first multi-strobe STB and a selector 33B for selecting any of the occurrence timings stored in the timing memory 33A based on the judgment results stored by the memory 32. The timing memory 33A stores, for example, 16 kinds of time values of 200 PS, 300 PS, 400 PS, 500 PS . . . The time values correspond to the time value from the initial phase position of each test cycle TD, and represent the timing of rising or falling of the reference clock DQS measured. The timing, which indicates the time value stored by the timing memory 33A, becomes the reference phase position of the first multi-strobe STB for detecting the transition point of the output data of the semiconductor device 108. The selector 33B selects any of the time values based on the measurement results stored by the memory 32, and supplies the time value selected to the first multi-strobe generator 34.

The first multi-strobe generator 34 adds or subtracts the time (the predetermined value) until the transition point of the value of the output data of the semiconductor device 108 to or from the time value received from the timing selecting circuit 33, generates the first multi-strobe STB at the timing based on the operation results, and supplies the first multi-strobe STB to the signal reading circuit 11. The signal reading circuit 11 detects the value of the output data outputted by the semiconductor device 108 at the timing of each of the first multi-strobe STB received. The apparatus for testing a semiconductor device 100 judges the quality of the semiconductor device 108 based on the value of the output data detected by the signal reading circuit 11.

The first multi-strobe generator 34 may have the same configuration as the second multi-strobe generator 30, and may generate the first multi-strobe having a plurality of strobes based on the strobe number of the second multi-strobe stored in the memory 32 that is the reference phase memory. The first multi-strobe generator 34 may set the phase of the first multi-strobe based on the time value inputted from the timing selecting circuit 33 and the predetermined time until the transition point of the value of the output data of the semiconductor device 108. The first multi-strobe generator 34 generates the first multi-strobe having a plurality of strobes, of which the phases are different by a small amount, in regard to the output data of the semiconductor device 108, and the apparatus for testing a semiconductor device 100 detects the value of the output data of the semiconductor device 108 in regard to the phase of each of the first multi-strobe so as to detect the rising or falling of the output data.

In regard to the semiconductor device 108, the design value of the time from the timing of rising or falling of the reference clock DQS to the transition point of the value of the output data outputted by the semiconductor device 108 is predetermined. Therefore, it is possible to easily presume the approximate value of the phase of the transition point of the value of the output data by measuring the timing of rising or falling of the reference clock DQS in advance and making the timing be a known value. The apparatus for testing a semiconductor device 100 in the present embodiment detects the timing of rising or falling of the reference clock DQS in advance, so that it can detect the transition point of the value of the output timing effectively by setting the occurrence timing and the occurrence range of the first multi-strobe STB for detecting the transition point of the value of the output data based on the timing detected.

Figure 8:
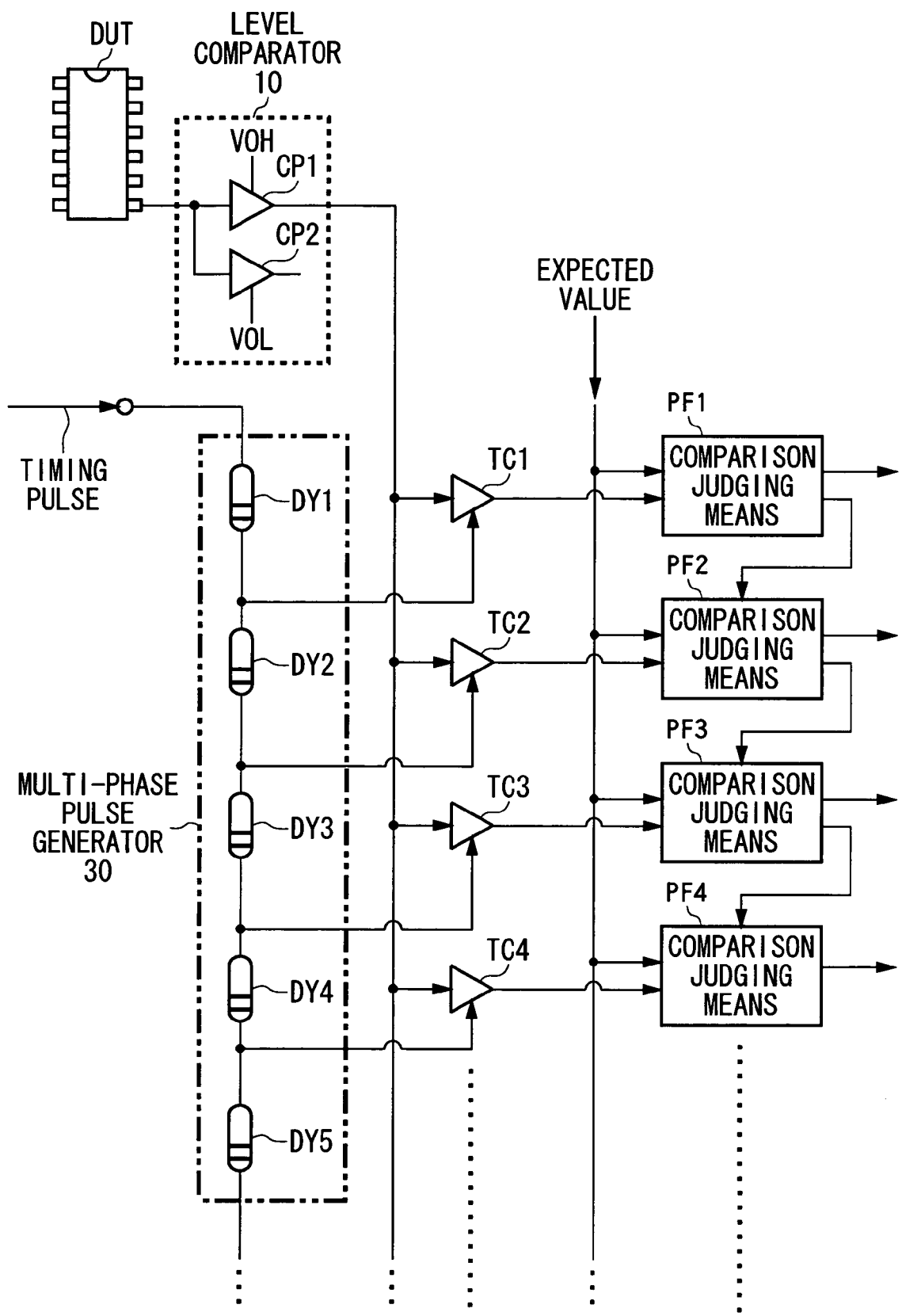
FIG. 8 shows an alternative embodiment of a second multi-strobe generator 30.

FIG. 8 shows an alternative embodiment of the second multi-strobe generator 30. In the present embodiment, the second multi-strobe generator 30 has delay devices DY1, DY2, DY3 . . . , DYn that have an equal delay time one another connected in cascade. The second multi-strobe generator 30 generates the second multi-strobe having a plurality of strobes, of which the phases are different by a small amount, based on each of the output signals of the delay devices DY1, DY2, DY3 . . . , DYn connected in cascade.

According to the apparatus for testing a semiconductor device 100 in the present embodiment, by using the second multi-strobe P1, P2, P3, P4, P5 . . . , Pn and P1', P2', P3', P4', P5' . . . , Pn' shown in FIG. 3 and FIG. 4, it is possible to measure the timing of rising or falling of the reference clock DQS in a considerably short time in comparison to the prior art in order to measure the timing of rising or falling of the reference clock DQS within the time of one test cycle TD.

Figure 9:
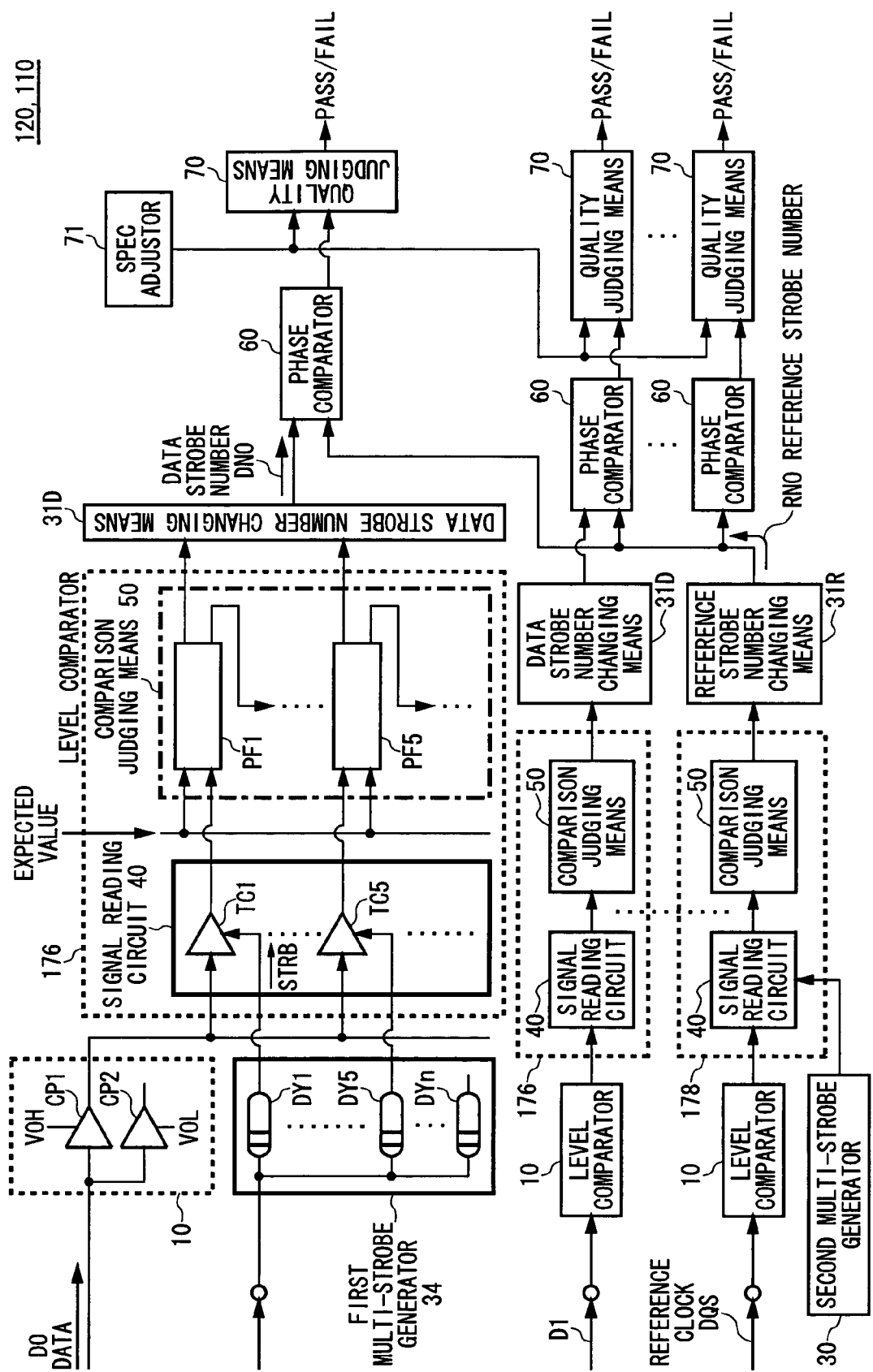
FIG. 9 shows another example of the configurations of a processor 120 and a judging unit 110.

FIG. 9 shows another example of the configurations of the processor 120 and the judging unit 110. The processor 120 has a level comparator 10, an output data transition point detector 176, a data strobe number changing means 31D, a phase comparator 60, a reference clock transition point detector 178 and a reference strobe number changing means 31R. In addition, the judging unit 110 has a spec adjuster 71 and a quality judging means 70. In FIG. 9, the parts corresponding to those in FIG. 2 are given the same symbols.

The output data transition point detector 176 and the reference clock transition point detector 178 have a signal reading circuit 40 and a comparison judging means 50. The output data transition point detector 176 detects the timing of rising or falling of the waveform of the output data based on the first multi-strobe. Moreover, the reference clock transition point detector 178 detects the timing of rising or falling of the waveform of the reference clock DQS.

In the present embodiment, the level comparator 10 compares the levels of the output data D0, D1, . . . , Dn and the reference clock DQS outputted by the semiconductor device 108 with the reference voltage VOH or VOL. The level comparator 10 supplies the level comparison results to the signal reading circuit 40. The level comparator 10 may have the same function and configuration as those of the level comparator 10 described in regard to FIG. 2.

The signal reading circuit 40 detects the values of the reference clock DQS and the output data D0, D1, . . . , Dn of the semiconductor device 108 based on the timing of the first multi-strobe or the second multi-strobe generated by the first multi-strobe generator 34 or the second multi-strobe generator 30. The signal reading circuit 40 may have the same function and configuration as those of the signal reading circuit 40 described in regard to FIG. 2. Moreover, although the processor 120 has the first multi-strobe generator 34 that generates the first multi-strobe and the second multi-strobe generator 30 that that generates the second multi-strobe in the present embodiment, the processor 120 may have a multi-strobe generator that generates the first multi-strobe and the second multi-strobe in another embodiment.

The comparison judging means 50 detects the transition point of the value of the output signals and the reference clock based on the value the output signals and the reference clock DQS that are detected by the signal reading circuit 40. The comparison judging means 50 may have the same function and configuration as those of the comparison judging means 50 described in regard to FIG. 2.

In FIG. 9, the processor 120 measures the values of the output data D0, D1, . . . Dn of the semiconductor device based on the first multi-strobe that is generated by the first multi-strobe generator 34. In addition, the processor 120 measures the values of the reference clock DQS based on the second multi-strobe that is generated by the second multi-strobe generator 30. The first multi-strobe generator 34 and the second multi-strobe generator 30 may have the same function and configuration. For example, both of the first multi-strobe generator 34 and the second multi-strobe generator 30 have a plurality of delay devices that is connected in cascade, supply strobes to the plurality of delay devices connected in cascade, and generate the first multi-strobe or the second multi-strobe based on the strobes respectively delayed and outputted by the plurality of delay devices.

The comparison judging means 50 receives the values of the output data and the reference clock DQS from the signal reading circuit 40, and judges which phase of a strobe of the multi-strobe the values of the data D0, D1, . . . , Dn and the reference clock DQS change at the timing in regard to based on the signals that are received.

The comparison judging means 50 detects the values of the output data of the semiconductor device 108 changed into the digital data in regard to the phase of each of the first multi-strobe, and detects the phase of a first strobe as the transition point of the value of the output data, if the value of the output data in regard to the phase of the first strobe of the first multi-strobe and the value of the output data in regard to the phase of a second strobe adjacent to the first strobe are different. For example, the comparison judging means 50 detects the transition point of the value of the output data in the same way as that of the comparison judging means 50 described in regard to FIG. 2.

In addition, the comparison judging means 50 detects the values of the reference clock DQS changed into the digital data in regard to the phase of each of the second multi-strobe, and detects the phase of a third strobe as the transition point of the value of the output data, if the value of the output data in regard to the phase of the third strobe of the second multi-strobe and the value of the output data in regard to the phase of a fourth strobe adjacent to the third strobe are different. For example, the comparison judging means 50 detects the transition point of the value of the reference clock DQS in the same way as that of the comparison judging means 50 described in regard to FIG. 2.

The judging unit 110 judges the quality of the electronic device 108 based on the phase of the transition point of the value of the output data and the phase of the transition point of the value of the reference clock DQS. And, in the comparison judging means 50, like the case described in regard to FIG. 5, only the judging device corresponding to the strobe, with which the transition point of the signal is detected, outputs [1] by priority.

The data strobe number changing means 31D receives the judgment result judged by the comparison judging means 50 about which strobe of a phase the transition point of the value of the output data D0, D1, . . . , Dn is detected with. In the present embodiment, the data strobe number changing means 31D, like the changing means 31 described in relation to FIG. 2, receives the digital signals from each of the judging devices PF1 to PFn of the comparison judging means 50, and generates the digital signal that indicates the strobe number DN0, wherein the transition point is detected, based on the digital signals received.

The reference strobe number changing means 31R receives the judgment result judged by the comparison judging means 50 about which strobe of a phase the transition point of the value of the reference clock DQS is detected with. In the present embodiment, the reference strobe number changing means 31R, like the changing means 31 described in relation to FIG. 2, receives the digital signals from each of the judging devices PF1 to PFn of the comparison judging means 50, and generates the digital signal that indicates the strobe number RN0, wherein the transition point is detected, based on the digital signals received.

Figure 10:
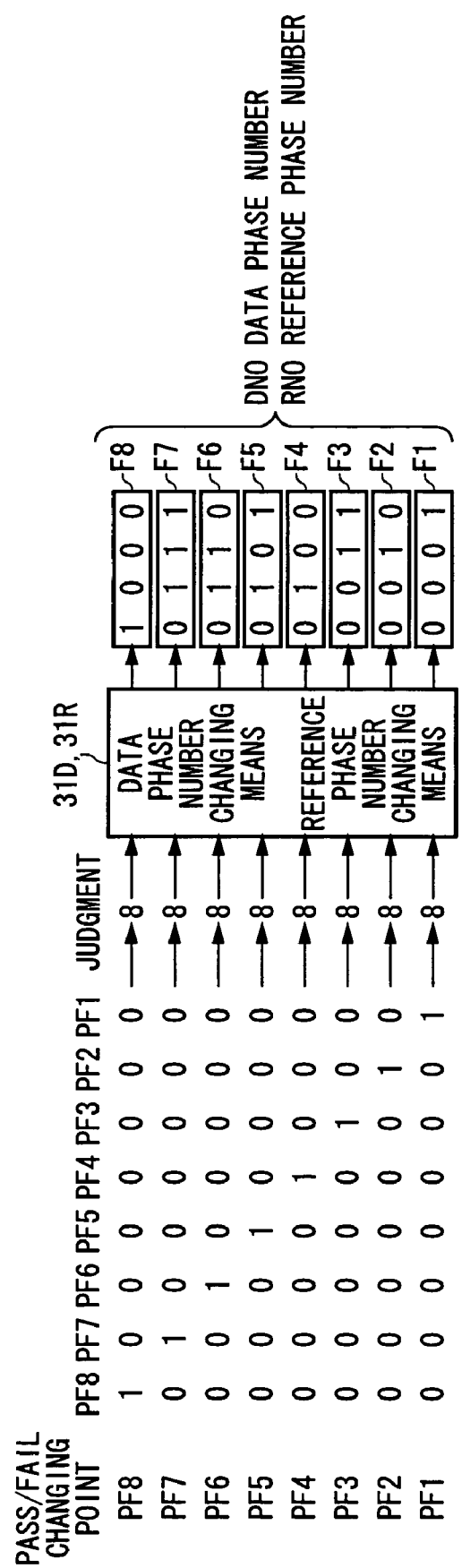
FIG. 10 shows an operation algorithm of a data strobe number changing means 31D and a reference strobe number changing means 31R.

FIG. 10 shows an operation algorithm of the data strobe number changing means 31D and the reference strobe number changing means 31R. In the present embodiment, the data strobe number changing means 31D and the reference strobe number changing means 31R may operate based on the same algorithm as the changing means 31 described in relation to FIG. 6. The data strobe number changing means 31D and the reference strobe number changing means 31R change the bit position, in which the comparison judging means 50 outputs the H logic (the H logic is represented by 1 in FIG. 10), into the numeral data F1 to F8. That is, the data strobe number changing means 31D and the reference strobe number changing means 31R outputs the numeral data F1 to F8 as the data strobe number DN0, wherein the transition point of the value of the output data is detected, and the reference strobe number RN0, wherein the transition point of the value of the reference clock DQS is detected. The phase comparator 60 (cf., FIG. 9) detects the phase difference between the phase of the transition point of the value of the output data and the phase of the transition point of the value of the reference clock based on the data strobe number DN0 and the reference strobe number RN0.

Figure 11:
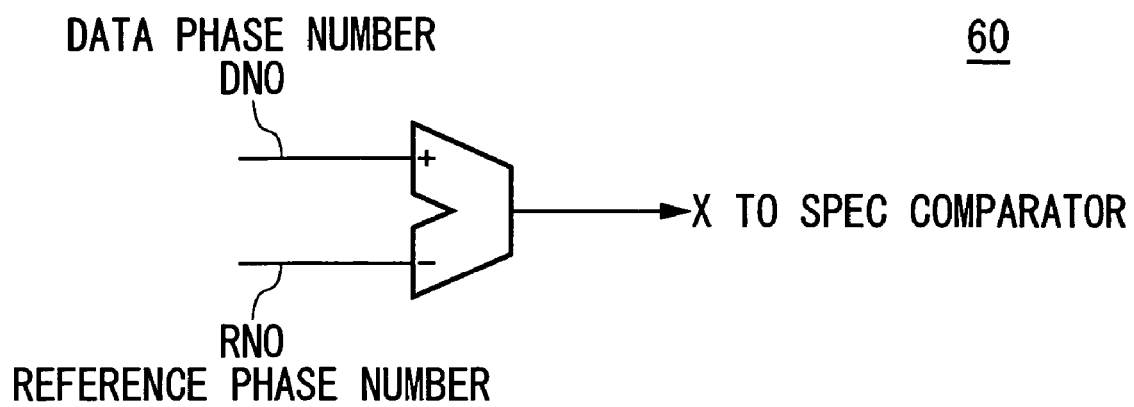
FIG. 11 shows an example of the configuration of a phase comparator 60.

FIG. 11 shows an example of the configuration of the phase comparator 60. In the present embodiment, the phase comparator 60 has a digital subtractor. As shown in FIG. 11, the phase comparator 60 inputs the data strobe number DN0 into the plus input terminal of the digital subtractor, and inputs the reference strobe number RN0 into the minus input terminal. The digital subtractor supplies the quality judging means 70 with the value of the data strobe number DN0 from which the reference strobe number RN0 is subtracted.

Figure 12:
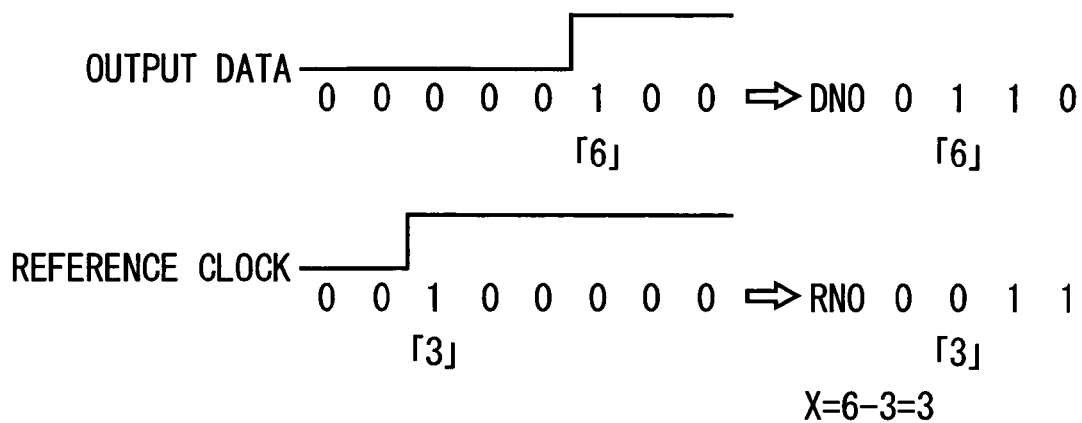
FIG. 12 shows an example of the operation in regard to a phase comparator 60.

FIG. 12 shows an example of the operation in regard to the phase comparator 60. As shown in FIG. 12, if the comparison judging means 50 outputs the digital signal that represents 00100000 as the detection result of the transition point of the value of the output data, the data strobe number changing means 31D outputs the digital signal 0110 that represents the numeral value 6 as the data strobe number DN0. And, if the comparison judging means 50 outputs the digital signal that represents 00000100 as the detection result of the transition point of the value of the reference clock DQS, the reference strobe number changing means 31R outputs the digital signal 0011 that represents the numeral value 3 as the data strobe number RN0. The phase comparator 60 supplies the quality judging means 70 with the digital signal that represents the numeral value 3, the result of the data strobe number DN0 from which the reference strobe number RN0 is subtracted.

Figure 13:
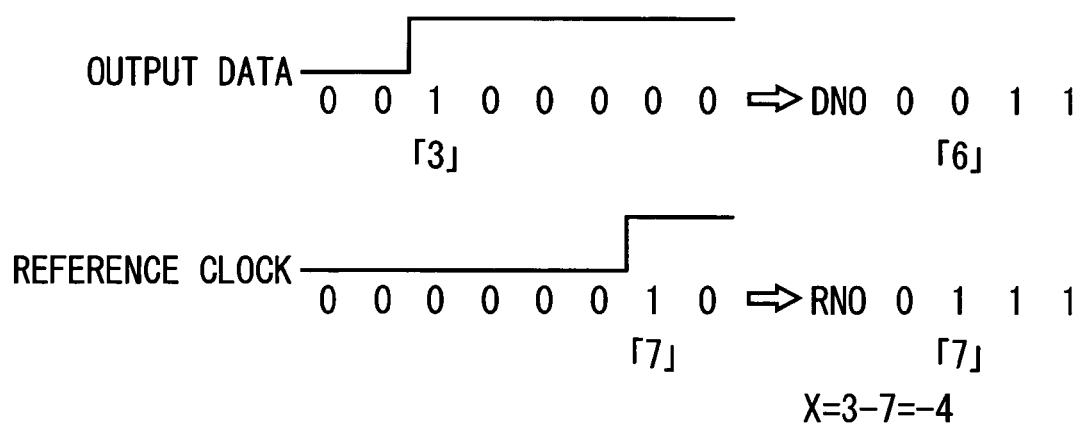
FIG. 13 shows another example of the operation in regard to a phase comparator 60.

FIG. 13 shows another example of the operation in regard to the phase comparator 60. As shown in FIG. 13, if the comparison judging means 50 outputs the digital signal that represents 00000100 as the detection result of the transition point of the value of the output data, the data strobe number changing means 31D outputs the digital signal 0011 that represents the numeral value 3 as the data strobe number DN0. And, if the comparison judging means 50 outputs the digital signal that represents 01000000 as the detection result of the transition point of the value of the reference clock DQS, the reference strobe number changing means 31R outputs the digital signal 0111 that represents the numeral value 7 as the data strobe number RN0. The phase comparator 60 supplies the quality judging means 70 with the digital signal that represents the numeral value 4, the result of the data strobe number DN0 from which the reference strobe number RN0 is subtracted. The comparison judging means 50 may supply the quality judging means 70 with the operation result in the form of, for example, digital signals of binary numbers.

Figure 14:
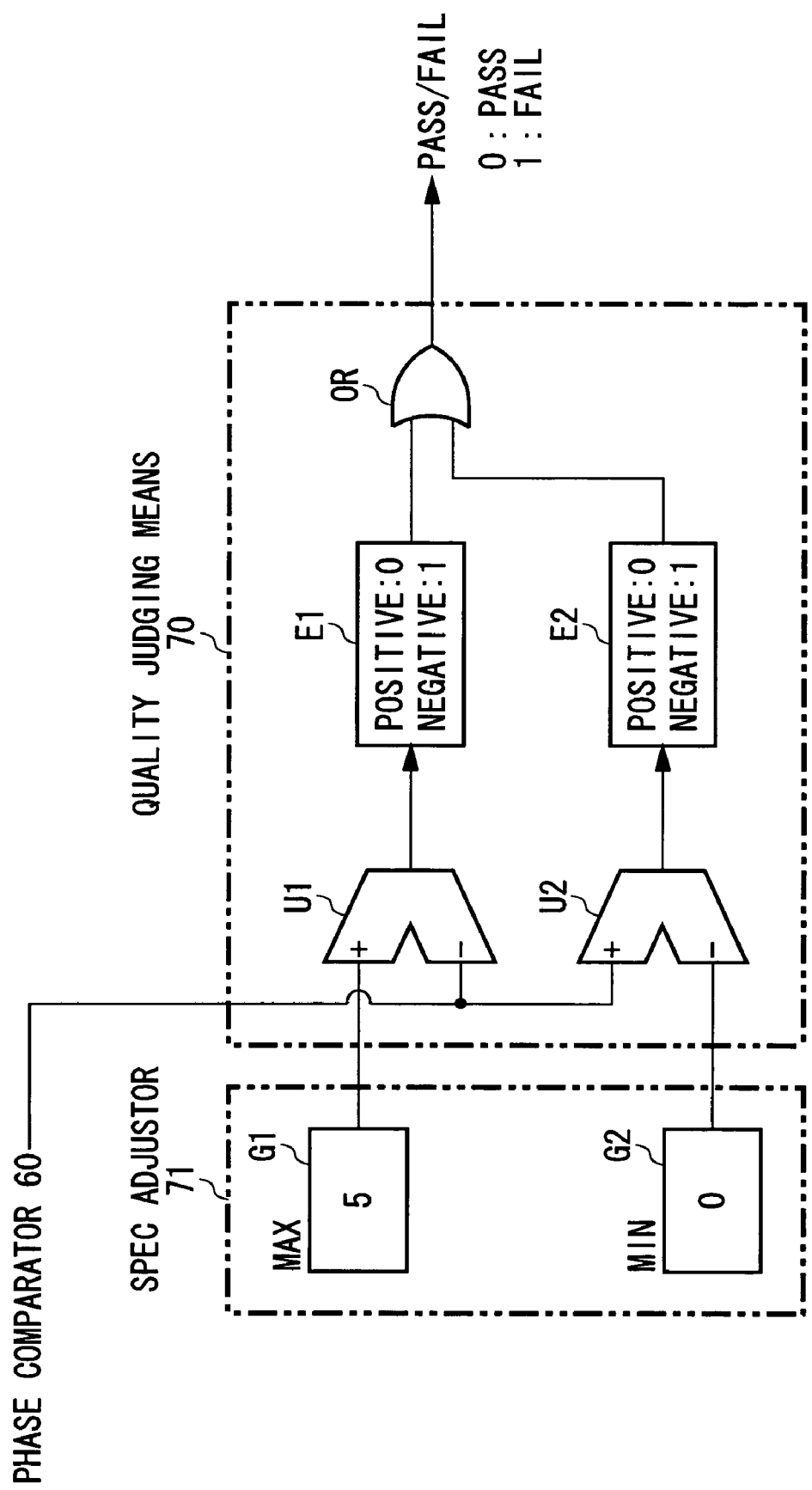
FIG. 14 shows an example of the configurations of a quality judging means 70 and a spec adjuster 71.

FIG. 14 shows an example of the configurations of the quality judging means 70 and the spec adjuster 71. The quality judging means 70 may judge the quality of the semiconductor device 108 based on the timing of rising or falling of the waveform of the output data that is detected by the output data transition point detector 176 and the timing of rising or falling of the waveform of the reference clock DQS that is detected by the reference clock transition point detector 178. For example, the quality judging means 70 may judge the quality of the semiconductor device 108 based on whether or not the phase difference between the timing of rising or falling of the waveform of the output data detected by the output data transition point detector 176 and the timing of rising or falling of the waveform of the reference clock DQS detected by the reference clock transition point detector 178 is within a predetermined range.

In the present embodiment, the spec adjuster 71 has a register G1 and a register G2. The registers G1 and G2 may store the values based on the spec relating to the phase difference between the transition point of the value of the reference clock DQS and the transition point of the value of the output signals of the semiconductor device 108. For example, a user sets the setting values of specifications for the semiconductor device to be tested. The present embodiment will be described in case that the register G1 stores the data indicating the value 5 and the register G2 stores the data indicating the value 0.

The quality judging means 70 has, for example, a subtractor U1, a subtractor U2, an encoder E1, an encoder E2 and a gate OR. The subtractor U1 receives the comparison results outputted by the phase comparator 60 and the setting values stored by the register G1 of the spec adjuster 71. The subtractor U1 subtracts the comparison results in regard to the phase comparator 60 from the setting values stored by the register G1. For example, if the register G1 stores the data indicating the value 5 and the phase difference comparator 60 outputs the data indicating the value 3, the subtractor U1 supplies the data indicating the value 2 to the encoder E1.

The subtractor U2 receives the comparison results outputted by the phase comparator 60 and the setting values stored by the register G2 of the spec adjuster 71. The subtractor U2 subtracts the setting values stored by the register G1 from the comparison results in regard to the phase comparator 60. For example, if the register G2 stores the data indicating the value 0 and the phase difference comparator 60 outputs the data indicating the value 3, the subtractor U2 supplies the data indicating the value 3 to the encoder E1.

The encoders E1 and E2 output the L logic (represented by 0 in FIG. 14) if the respectively corresponding subtractor U1 or U2 outputs 0 or the positive value, and output the H logic (represented by 1 in FIG. 14) if the corresponding subtractor U1 or U2 outputs the negative value. The gate OR outputs the logical sum of the data outputted by the encoder E1 and the data outputted by the encoder E2 as the judgment result of the quality of the semiconductor device 108. The judging unit 110 judges the semiconductor device 108 as a pass (good) if the gate OR outputs 0, and judges the semiconductor device 108 as a fail (bad) if the gate OR outputs 1. For example, if the phase comparator 60 outputs the data indicating 3, the register G1 stores the data indicating 5 and the register G2 stores the data indicating 0, then both the encoders E1 and E2 output the L logic. The gate OR outputs the L logic, and the judging unit 110 judges the semiconductor device 108 as the pass (good). That is, in the present embodiment, the judging unit 110 judges the quality of the semiconductor device based on whether the difference between the strobe number of the first multi-strobe, wherein the transition point of the value of the output data is detected, and the strobe number of the second multi-strobe, wherein the transition point of the value of the reference clock is detected, is within a predetermined range or not. In the present embodiment, the register G1 stores the upper limit value of the phase difference between the transition point of the value of the output data and the transition point of the value of the reference clock, and the register G2 stores the lower limit value of the phase difference between the transition point of the value of the output data and the transition point of the value of the reference clock. The judging unit 110 judges the semiconductor device 108 as the pass (good) if the phase difference detected by the phase comparator 60 between the transition point of the value of the output data and the transition point of the value of the reference clock is between the upper limit value and the lower limit value.

Figure 15:
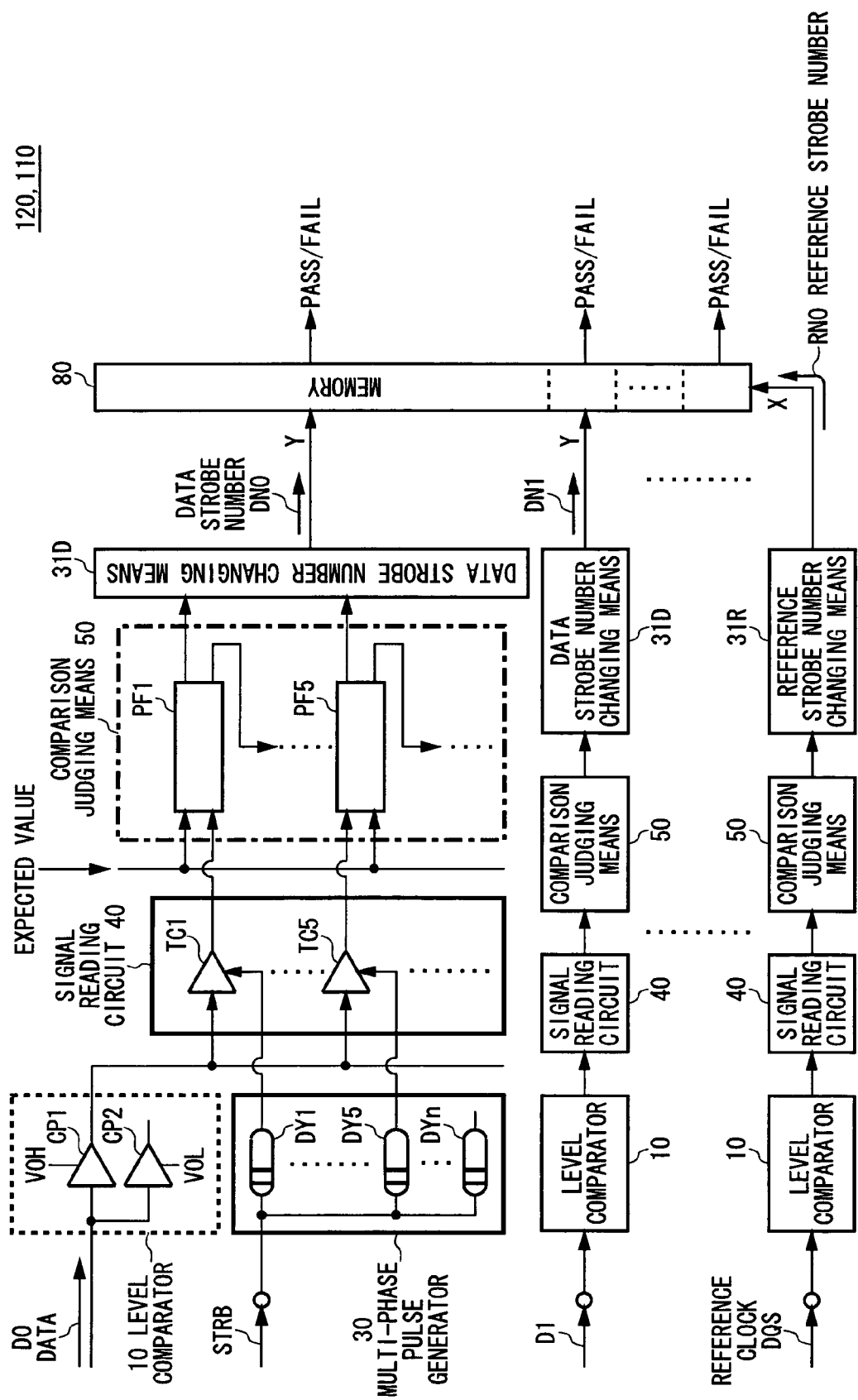
FIG. 15 shows an alternative embodiment of a processor 120 and a judging unit 110.

FIG. 15 shows an alternative embodiment of the processor 120 and the judging unit 110. In FIG. 15, the things given the same symbols as those in FIG. 9 may have the same function and configuration as those described in regard to FIG. 9. The processor 120 may have the same function and configuration as the processor 120 described in regard to FIG. 9. In addition, the judging unit 110 has a memory 80 for storing the reference table in order to judge the quality of the semiconductor device 108 based on the combination of the output of the data strobe number changing means 31D and the output of reference strobe number changing means 31R. The judging unit 110 refers to the reference table based on the output of the data strobe number changing means 31D and the output of reference strobe number changing means 31R, and outputs the reference result as the judgment result of the quality of the semiconductor device 108. That is, the judging unit 110 judges the quality of the semiconductor device 108 based on the reference table by having a means for storing the reference table to set the quality of the semiconductor device 108 corresponding to the combination of the strobe number of the first multi-strobe, wherein the transition point of the value of the output data is detected, and the strobe number of the second multi-strobe, wherein the transition point of the value of the reference clock is detected.

The memory 80 stores the reference table in the form of, for example, a matrix. For example, the memory 80 receives the data strobe number DN0 as the data indicating a column number, and receives the reference strobe number RN0 as the data indicating a row number. The memory 80 detects the quality judgment data stored in the address corresponding to the row and column numbers by referring to the reference table based on the row and column numbers indicated by the data strobe number DN0 and the reference strobe number RN0 received.

FIG. 16 shows an example of the reference table stored by the memory 80. FIG. 16A shows the difference between the data strobe number DN0 and the reference strobe number DN0. For example, if the number difference between the data strobe number DN0 and the reference strobe number DN0 judges the semiconductor device 108 as the pass (good), that is, within the range from −2 to +2, the memory 80 stores the signal (P) indicating the pass into the address corresponding to the cell within the range from −2 to +2 in regard to the table in FIG. 16A as the reference table shown in FIG. 16B, and stores the signal (F) indicating the fail into the address corresponding to the cell out of the range from −2 to +2.

According to the apparatus for testing a semiconductor device 100 in the present embodiment, it is possible to easily judge the quality by referring to the reference table based on the combination of the reference strobe number RN0 and the data strobe number DN0 provided in the memory 80 storing the reference table. In addition, according to the apparatus for testing a semiconductor device 100 in the present embodiment, since it judges the quality by measuring the phase difference of the transition point of the value of the reference clock and the output data in real time and judging whether the phase difference is within a predetermined range or whether the output data is earlier or later than the reference clock etc., it is possible to perform the test by generating the test patterns as many as only one cycle from the start to the end. Consequently, it is possible to finish the test in a shorter time than the prior art. In addition, it is possible to analyze the fluctuation or the jitter of the phase difference between the data and the reference clock by storing each of the output values of a plurality of the phase comparators 60 into the memory or the like from the start to the end.

Figure 17:
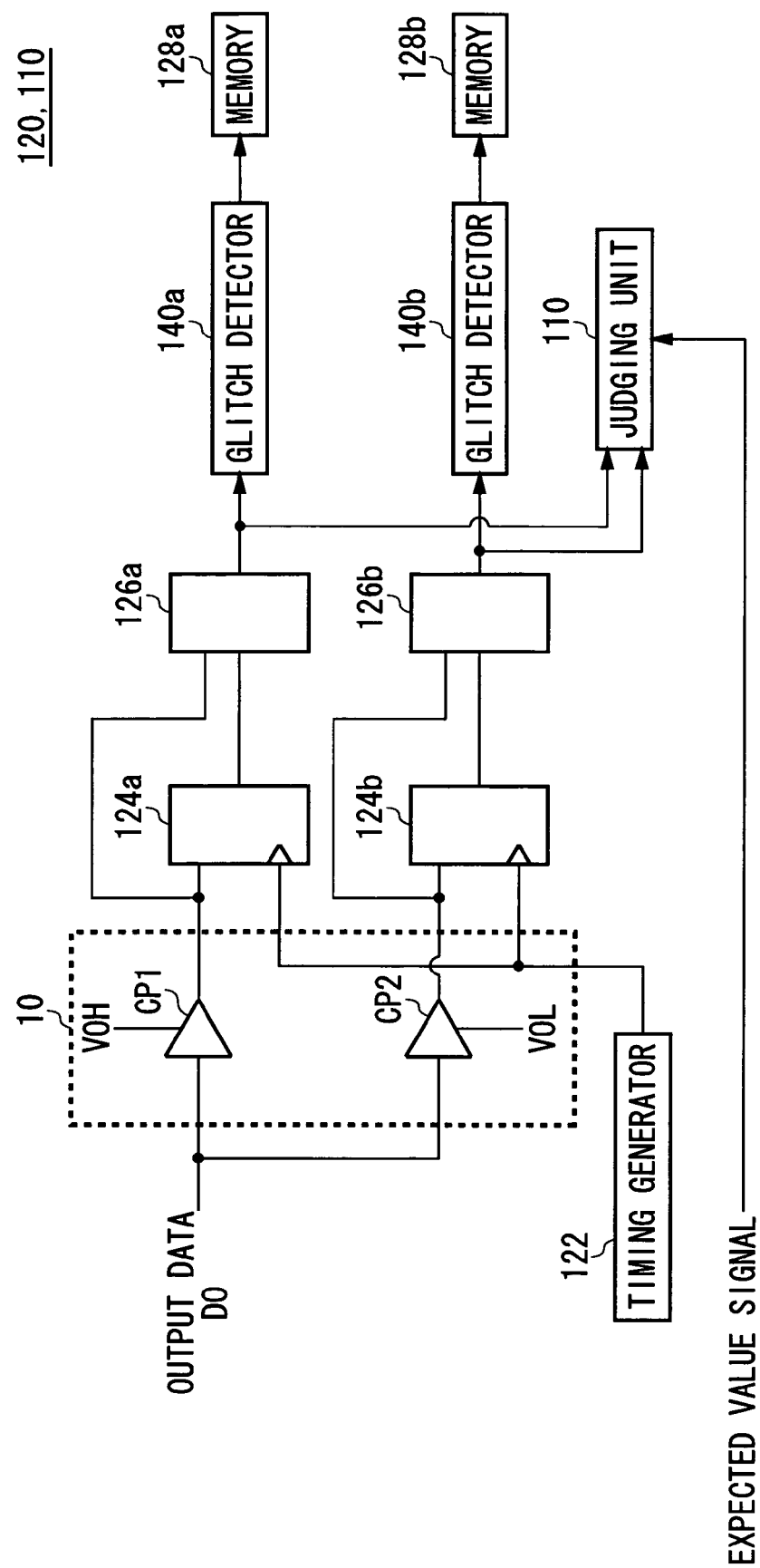
FIG. 17 shows another example of the configurations of a processor 120 and a judging unit 110.

FIG. 17 shows another example of the configurations of the processor 120 and the judging unit 110. The processor 120 has a level comparator 10, a timing comparator 124, a selector 126, a glitch detector 140, a memory 128 and a timing generator 122. As the configuration of the processor 120 and the judging unit 110, FIG. 17 shows the configuration of the processor 120 and the judging unit 110 corresponding to the output data D0 outputted by one of the pins of the semiconductor device 108, however the processor 120 and the judging unit 110 may have the same configuration as that in FIG. 17 corresponding to each of a plurality of pins of the semiconductor device 108.

The level comparator 10 has the same function and configuration as those of the level comparator 10 described in relation to FIG. 2 and FIG. 9. The level comparator 10 receives the output data D0 of the semiconductor device 108, and supplies a timing comparator 124a or a selector 126a with the signals (hereinafter, referred to as SH signals) indicating the H logic for the phase taking a higher voltage level than the reference voltage VOH and the L logic for the phase taking a lower voltage level than the reference voltage VOH, in regard to the output data D0. In addition, the level comparator 10 supplies a timing comparator 124b or a selector 126b with the signals (hereinafter, referred to as SL signals) indicating the H logic for the phase taking a higher voltage level than the reference voltage VOL and the L logic for the phase taking a lower voltage level than the reference voltage VOL, in regard to the output data D0.

The timing generator 122 supplies the timing of a predetermined time interval to the timing comparator 124a and the timing comparator 124b. The timing comparator 124a and the timing comparator 124b supply the logical values of the SH signals or the SL signals to the selector 126a or the selector 126b at the timing received as the digital data (hereinafter, referred to as the FH signals and the FL signals). The timing generator 122 may have the same function and configuration as those of the second multi-strobe generator 30 described in relation to FIG. 9. The timing comparator 124a and the timing comparator 124b may have the same function and configuration as those of the signal reading circuit 40 described in relation to FIG. 9.

The selector 126a selects whether to supply the SH signals received to a glitch detector 140a, or whether to supply the FH signals received to the judging unit 110. In addition, the selector 126b selects whether to supply the SL signals received to a glitch detector 140b, or whether to supply the FL signals received to the judging unit 110. The glitch detector 140a and the glitch detector 140b detect the existence of the glitch in regard to the output data D0 based on the SH signals or the SL signals received. For example, the glitch detector 140 detects the existence of the glitch in regard to the output data D0 based on the transition point of the value of the output data. A memory 128a and a memory 128b store the detection results of the glitch detector 140.

The judging unit 110 judges the quality of the semiconductor device 108 based on the FH signals, the FL signals received and expected signals outputted by the pattern generator 102. In addition, the judging unit 110 may judge the quality of the semiconductor device 108 based on the existence of the glitch in regard to the output data detected by the glitch detector 140. Hereinafter, the configuration and function of the glitch detector 140 will be described in detail.

Figure 18:
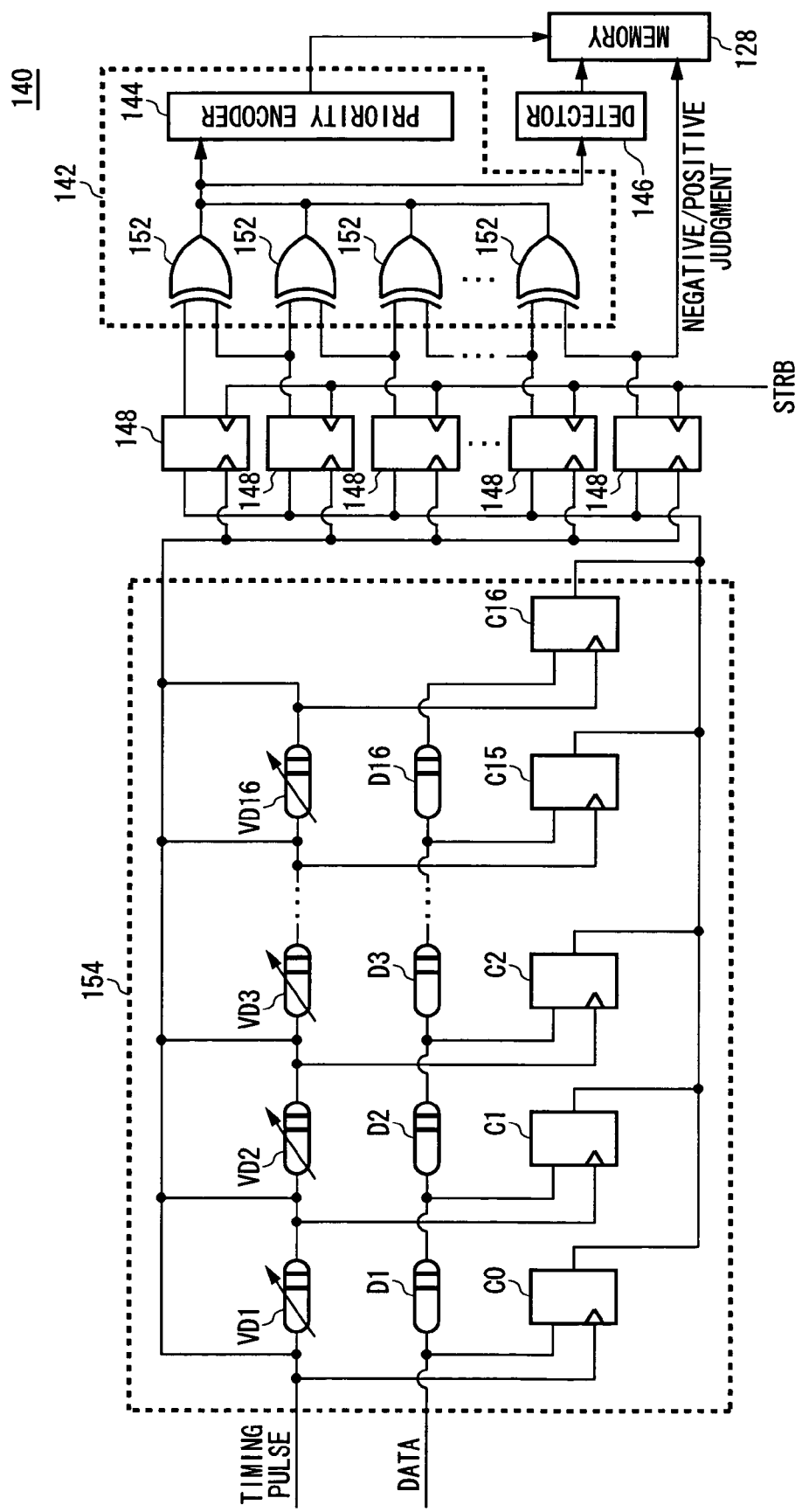
FIG. 18 shows an example of the configuration of a glitch detector 140.

FIG. 18 shows an example of the configuration of the glitch detector 140. The glitch detector 140 has a first multi-strobe generator 154, memories 148, an output data transition point detector 142 and a detector 146.

The first multi-strobe generator 154 generates the first multi-strobe having a plurality of strobes, of which the phases are different by a small amount, in regard to the output data. The first multi-strobe generator 154 has a plurality of delay devices VD1, VD2, VD3, ..., VD16 connected in cascade, a plurality of delay devices D1, D2, D3, ..., D16 connected in cascade and a plurality of timing comparators C0, C1, C2, ... C15, C16. The first multi-strobe generator 154 receives the timing strobe for generating the first multi-strobe and the output data. In the present embodiment, the delay devices VD1, VD2, VD3, ..., VD16 are changeable delay devices. The first multi-strobe generator 154 supplies the timing strobe to the delay devices VD1, VD2, VD3, ..., VD16 connected in cascade, and takes a plurality of strobes, of which the phases are different by a small amount, from the input and output of each of the delay devices. The phase differences in regard to the plurality of strobes are approximately equal to the delay amounts in regard to the respectively corresponding delay devices VD1, VD2, VD3, ..., VD16. In addition, the first multi-strobe generator 154 may take the timing strobe from the timing generator 122.

Moreover, in the present embodiment, the first multi-strobe generator 154 receives the SH signals as the output data, and detects the values of the SH signals in regard to the phase of each of the strobes, of which the phases are different by a small amount, taken from the input and output of the delay devices VD1, VD2, VD3, ..., VD16. First, the first multi-strobe generator 154 takes the timing strobe in regard to the input of a delay device VD1 and the SH signals, and supplies them to a timing comparator C0. The timing comparator C0 detects the values of the SH signals at the timing of the timing strobe. Next, the first multi-strobe generator 154 receives the timing strobe delayed as much as the delay amount in regard to the delay device VD1 and the SH signals in regard to the output of the delay device VD1, and supplies them to a timing comparator C1. The timing comparator C1 detects the values of the SH signals at the timing of the timing strobe in regard to the output of the delay device VD1. In the same way, the timing comparators C2, C3, ..., C16 detect the values of the SH signals at the timing of the timing strobe in regard to the output of the respectively corresponding delay devices.

Moreover, as shown in FIG. 18, the first multi-strobe generator 154 supplies the SH signals to a plurality of delay devices D1, D2, D3, ..., D16 connected in cascade, and the timing comparators C1, C2, ..., C16 may detect the values of the SH signals in regard to the output of the respectively corresponding delay devices D1, D2, D3, ..., D16. In this case, the delay amounts in regard to the plurality of delay devices D1, D2, D3, ..., D16 are approximately equal to the offset delay amounts in regard to the plurality of delay devices VD1, VD2, VD3, ..., VD16. In the delay devices VD1, VD2, VD3, ..., VD16, there might be, for example, a delay in regard to the route (offset delay amount), other than the delay amount in regard to the delay devices. By delaying the SH signals as much as the offset delay amount in regard to the plurality of corresponding delay devices VD1, VD2, VD3, ..., VD16 by the plurality of the delay devices D1, D2, D3, ..., D16, the timing comparators C0, C1, C2, ..., C16 can detect the values of the SH signals with high accuracy.

In addition, the plurality of the delay devices VD1, VD2, VD3, ..., VD16 are changeable delay devices, so it is desirable to be able to adjust the delay in regard to the plurality of delay devices VD1, VD2, VD3, ..., VD16 to be a predetermined value against the delay in regard to the plurality of corresponding delay devices D1, D2, D3, ..., D16. For example, the present embodiment adjusts the delay amount in regard to the plurality of delay devices VD1, VD2, VD3, ..., VD16 in order to delay the timing strobe by 50 ps each against the delay in regard to the plurality of corresponding delay devices D1, D2, D3, ..., D16. According to the first multi-strobe generator 154 in the present embodiment, it is possible to perform sampling of the values of the output data of the semiconductor device 108 with a highly accurate timing.

A plurality of memories 148 receives the values of the SH signals detected by the timing comparators C0, C1, C2, ..., C16 respectively. The plurality of memories 148 is, for example, FIFO (First-in First-out) type memories. The plurality of memories 148 stores the values of the SH signals detected by the timing comparators C0, C1, C2, ..., C16 respectively with the timing of a plurality of strobes taken from the plurality of delay devices VD1, VD2, VD3, ..., VD16. The plurality of memories 148 supplies the output data transition point detector 142 with the data stored in order to first output the data first stored based on the timing at which the signals STRB are received, wherein the signals STRB is given for taking the data from the outside.

The output data transition point detector 142 has, for example, a plurality of digital circuits 152 and the priority encoder 144. The output data transition point detector 142 detects the values of the output data in regard to each of the first multi-strobe, and detects the phase of the first strobe as the transition point of the value of the output data, if the value of the output data in regard to the phase of a first strobe among the first multi-strobe and the value of the output data in regard to the phase of a second strobe adjacent to the first strobe are different. In FIG. 18, the plurality of digital circuits 152 respectively receive the value of the output data in regard to the strobe adjacent to the phase of the first multi-strobe from the memory 148, and judge that the value of the output data changes in regard to the phase of the strobe, if the value of the output data in regard to the strobe adjacent to the phase of the first multi-strobe is different.

For example, if the plurality of memories 148 in FIG. 18 stores 0001001111111111 in sequence as the value of the SH signals, the plurality of digital circuits 152 output 0011010000000000 in sequence. That is, the plurality of digital circuits 152 output the digital signals that represents the transition point of the value of the SH signals as 1. Each of the digital circuits 152 may be a digital circuit that outputs, for example, the exclusive logical sum.

According to the output data transition point detector 144 in the present embodiment, it is possible to easily calculate the phase of the transition point of the value of the output data based on the bit number of the transition point of the value of the SH signals and the delay amount of each of the plurality of delay devices VD1, VD2, VD3, ..., VD16 in regard to the digital signals outputted by the plurality of digital circuits 152.

The plurality of digital circuits 152 supplies the digital signals indicating the transition point of the value of the output data to the priority encoder 144 and the detector 146. The priority encoder 144 detects the transition point of the output data, in which the phase is earliest, based on the digital signals received. In the present embodiment, the priority encoder 144 receives the digital signals of 16 bits, and outputs the digital signals of 5 bits as the data of the transition point of the output data, in which the phase is earliest.

The detector 146 judges there is a glitch of the output data if a plurality of 1s exists in the digital signals received. The detector 146 outputs 1 if it detects the glitch, and outputs 0 if it does not detects the glitch.

The memory 128 stores the data outputted by the priority encoder 144 and the detector 146 to correspond with each other. It is possible to easily calculate the existence of the glitch, the phase of the glitch when there is the glitch in regard to the output data outputted by the semiconductor device 108 based on the data stored by the memory 128. In addition, it is possible to easily calculate the transition point of the value of the output data if there is no glitch. In addition, the memory 128 may receive the negative and/or positive judgment data in order to indicate whether the value of the output data changes from the H logic to the L logic or changes from the L logic to the H logic in regard to the transition point of the value of the output data. That is, the negative and/or positive judgment data is the data for indicating whether the rising of the output data is detected or the falling of the output data is detected in regard to the transition point of the value of the output data. The negative and/or positive judgment data may be the value of the output data at the timing of the strobe of the earliest phase in regard to the first multi-strobe as shown in FIG. 18.

Moreover, although the configuration of the glitch detector 140 has been described as the number of the strobe of the first multi-strobe is 16 in the present embodiment, it is obvious that the number of the strobe of the first multi-strobe may be another number in other embodiments. In this case, the glitch detector 140 has as many delay devices, memories 148 and digital circuits 152 as the number based on the number of strobe of the first multi-strobe to be generated.

Figure 19:
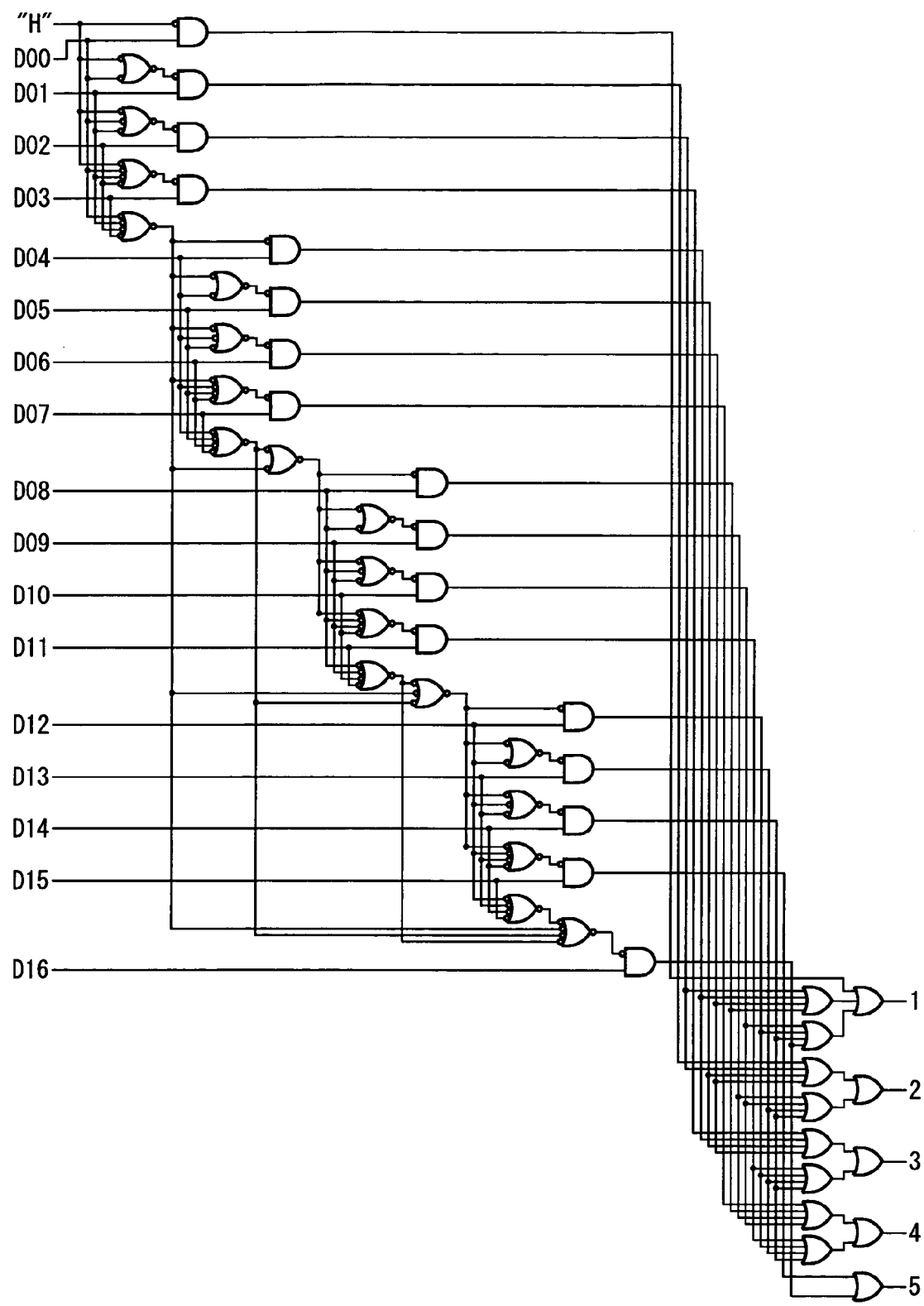
FIG. 19 shows an example of the configuration of a priority encoder 144.

FIG. 19 shows an example of the configuration of the priority encoder 144. The priority encoder 144 in the present embodiment has a plurality of logical multiply circuits and a plurality of logical summation circuits as shown in FIG. 19. The priority encoder 144 receives each of the data D00, D01, D02, ..., D16 from the plurality of digital circuits 152. The priority encoder 144 detects the transition point of the value of the output data, in which the phase is earliest, based on the data D00, D01, D02, ..., D16 received and the signals "H" indicating the H logic as shown in FIG. 19. In present embodiment, the priority encoder 144 receives the digital signal of 16 bits, and outputs the bit number of the digital signals, in which the transition point of the earliest phase is detected, in the form of the digital signals of 5 bits. Moreover, although it is the transition point of the earliest phase that is detected in the present embodiment, the transition point of the latest phase may be detected in other embodiments. For example, it is possible to detect the transition point of the latest phase by inputting the data reversely so as to input the data of D16 into the terminal of D00, the data of D15 into the terminal of D01, ..., the data of D00 into the terminal of D16 in FIG. 19.

FIG. 20 shows an example of the digital signals received by the priority encoder 144 shown in FIG. 19 and the digital signals outputted. As shown in FIG. 20, the priority encoder 144 outputs 00000, if there is no the transition point in the digital signals received. In addition, the priority encoder 144 outputs 00001, if there is the transition point of the earliest phase in D00. In the same way hereinafter, the priority encoder 144 outputs the digital signals corresponding to the input data number, wherein there is the transition point of the earliest phase.

Figure 21:
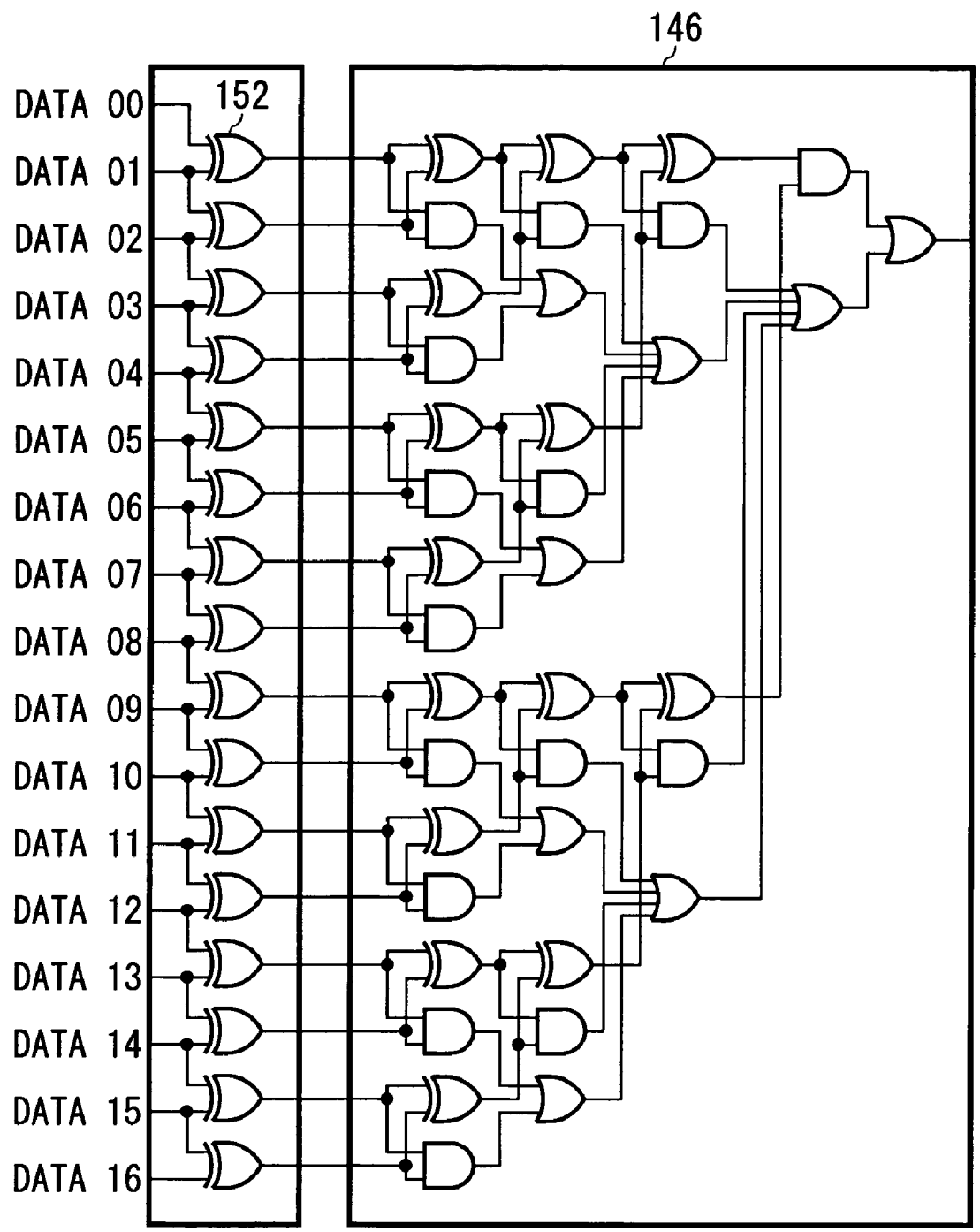
FIG. 21 shows an example of the configuration of a detector 146.

FIG. 21 shows an example of the configuration of the detector 146. The detector 146 detects the existence of the glitch in regard to the output data based on the digital signals received from the plurality of digital circuits 152. The detector 146 judges there is the glitch of the output data if the transition points of the value of the output data is more than or equal to 2. As shown in FIG. 21, the detector 146 has a digital circuit configuration to output 1 if there is a plurality of is in the digital signals received from the plurality of digital circuits 152 and to output 0 if there is none or one of 1.

FIG. 22 shows an example of the process and data configuration of the data stored by the memory 128. As shown in FIG. 22A, the selector 162 first receives the digital signals outputted by the priority encoder 140, the digital signals outputted by the detector 146 and the negative and/or positive judgment data for each of the SH signals or the SL signals from the glitch detector 140a and the glitch detector 140b.

The selector 162 receives the expected signals EXP from the outside, and selects and outputs either of the digital signals for the SH signals or the digital signals for the SL signals based on the expected signals EXP. The memory 128 stores the digital signals, to which the expected signals EXP are added, outputted by the selector 162.

The memory 128 stores the digital signals of 8 bits (the FH signals or the FL signals) as shown in FIG. 22B. In the data configuration of the digital signals of 8 bits, as shown in FIG. 22B, D7 indicates the expected signal EXP, D6 indicates the existence of the glitch, D5 indicates the negative and/or positive judgment data and D4 to D0 indicate the transition point of the value of the output data. The data D0 to D4 are the digital signals outputted by the priority encoder 144, and indicate the phase of the transition point of the value of the output data. In the present embodiment, each of the delay amounts in regard to the plurality of delay devices VD1, VD2, VD3, . . . , VD16 is 50 ps, and thus the value equivalent to the transition point code, from which 1 is subtracted and then is multiplied by 50 ps shown in FIG. 22B, indicates the phase of the transition point of the value of the output data.

The data of D5, which is the negative and/or positive judgment data, shows that the falling of the output data is detected in the phase indicating the transition point code in case of 1, and that the rising of the output data is detected in the phase indicating the transition point code in case of 0. The data of D6, which is the data outputted by the detector 146, shows that the glitch is detected in the output data in case of 1 and that the glitch is not detected in the output data in case of 0. The data of D7, which is the expected signals EXP, indicates that FH is stored as the H logic expectation in case of 1, and indicates that FL is stored as the L logic expectation in case of 0. That is, it indicates that the signals based on the SH signals is stored in case of 1, and indicates that the signals based on the SL signals is stored in case of 0.

It is possible to easily detect the existence of the glitch in regard to the output data, the phase of the glitch if there is a glitch and the phase of the rising or falling of the output data if there is no glitch based on the data stored by the memory 128. In addition, it is possible to divide the data to be tested into halves by storing either of the FH signals or the FL signals allowing the expected signals EXP and the FH signals or the FL signals to correspond to each other. In addition, the judging unit 110 may judge the quality of the semiconductor device 108 based on the data stored by the memory 128.

In the apparatus for testing a semiconductor device 100 described above, although the processor 120 has one of a first configuration described in relation to FIG. 2 to FIG. 8, a second configuration described in relation to FIG. 9 to FIG. 16 and a third configuration described in relation to FIG. 17 to FIG. 22 respectively, it is obvious that the apparatus for testing a semiconductor device 100 may have a processor 120 having a configuration of a certain combination of those configurations. For example, the apparatus for testing a semiconductor device 100 may have a processor 120 and a judging unit 110 of a combination of the third configuration having the glitch detection function and the first or second configuration. In this way, it is possible to perform the test with high accuracy and with various functions by combining a plurality of configurations.

Figure 23:
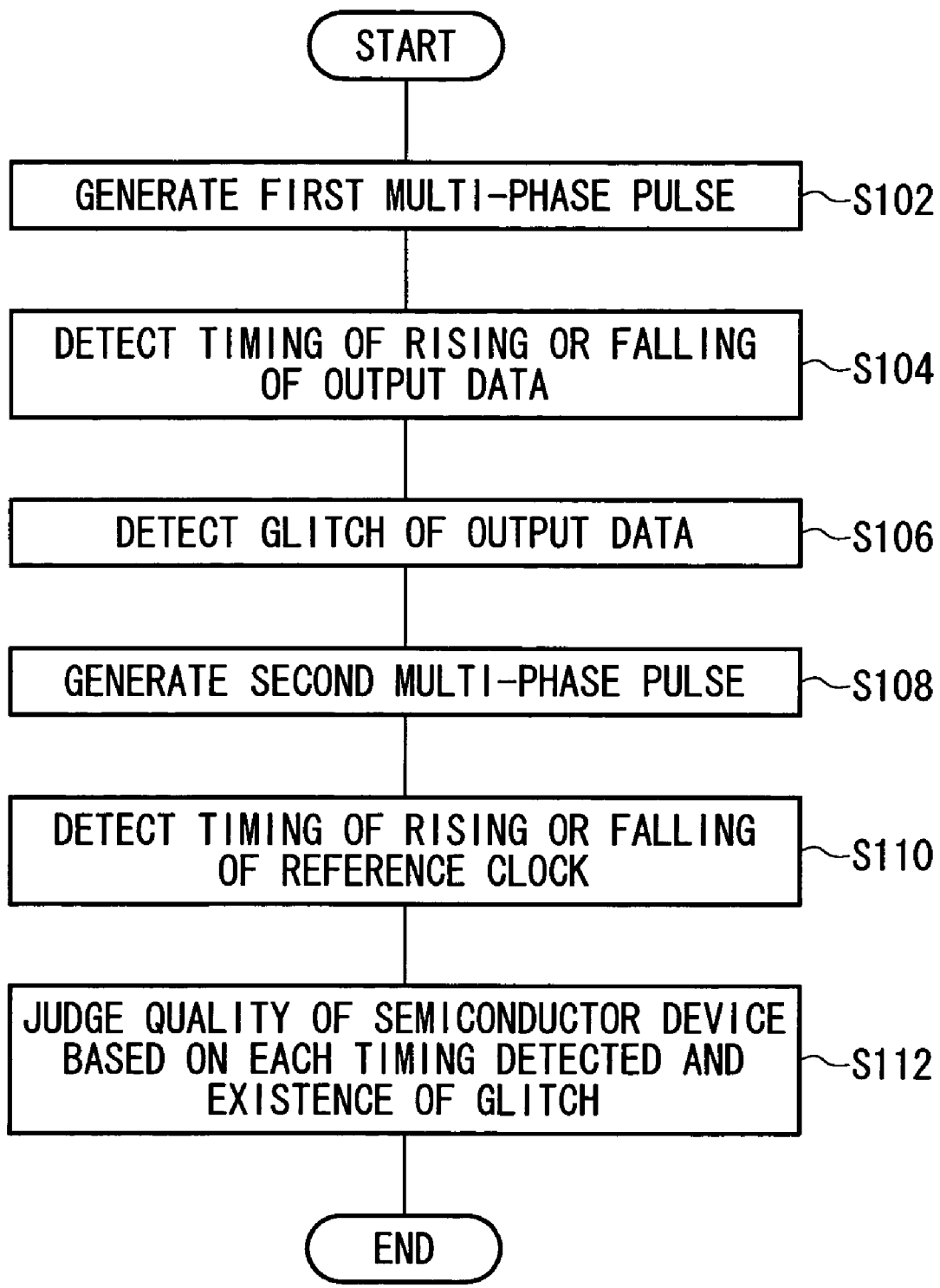
FIG. 23 shows a flowchart of an embodiment of a method for testing a semiconductor device relating to the present invention.

FIG. 23 shows a flowchart of an embodiment of a method for testing a semiconductor device relating to the present invention. First, in a first multi-strobe generating step, the first multi-strobe having a plurality of strobes, of which the phases are different by a small amount, is generated for the output data of a semiconductor device (S102). In S102, the first multi-strobe may be generated by using, for example, the first multi-strobe generator 34 described in relation to FIG. 9 or the first multi-strobe generator 154 described in relation to FIG. 18.

Then, in an output data transition point detecting step, the timing of rising or falling of the waveform of the output data is detected based on the first multi-strobe (S104). In S104, the timing of rising or falling of the waveform of the output data may be detected by using, for example, the output data transition point detector 176 described in relation to FIG. 9 or the output data transition point detector 142 described in relation to FIG. 18.

Then, in a glitch detecting step, the existence of the glitch in regard to the output data is detected based on the transition point of the value of the output data (S106). In S106, the existence of the glitch in regard to the output data may be detected by using, for example, the detector 146 described in relation to FIG. 18.

Then, in a second multi-strobe generating step, the second multi-strobe having a plurality of strobes, of which the phases are different by a small amount, is generated for the output data of a semiconductor device (S108). In S108, the second multi-strobe may be generated by using, for example, the second multi-strobe generator 174 described in relation to FIG. 9.

Then, in a reference clock transition point detecting step, the timing of rising or falling of the waveform of the reference clock is detected based on the second multi-strobe (S110). In S110, the timing of rising or falling of the waveform of the reference clock may be detected by using, for example, the reference clock transition point detector 178 described in relation to FIG. 9.

Then, in a judging step, the quality of the semiconductor device is judged based on the timing of rising or falling of the waveform of the output data detected in the output data transition point detecting step, the timing of rising or falling of the waveform of the reference clock detected in the reference clock transition point detecting step and the existence of the glitch detected in the glitch detecting step (S112). For example, the judging step may judge the semiconductor device as bad quality if there is a glitch of the output data, and may judge the quality of the semiconductor device by using the judging unit 110 described in relation to FIG. 9 if there is no glitch of the output data.

According to the method for testing a semiconductor device described above, it is possible to detect the rising or falling of the waveform of the output data and the reference clock DQS, and thus the test can be performed effectively. In addition, it is possible to easily detect the existence of the glitch in regard to the output data, and therefore the test can be performed with more high accuracy.

Figure 24:
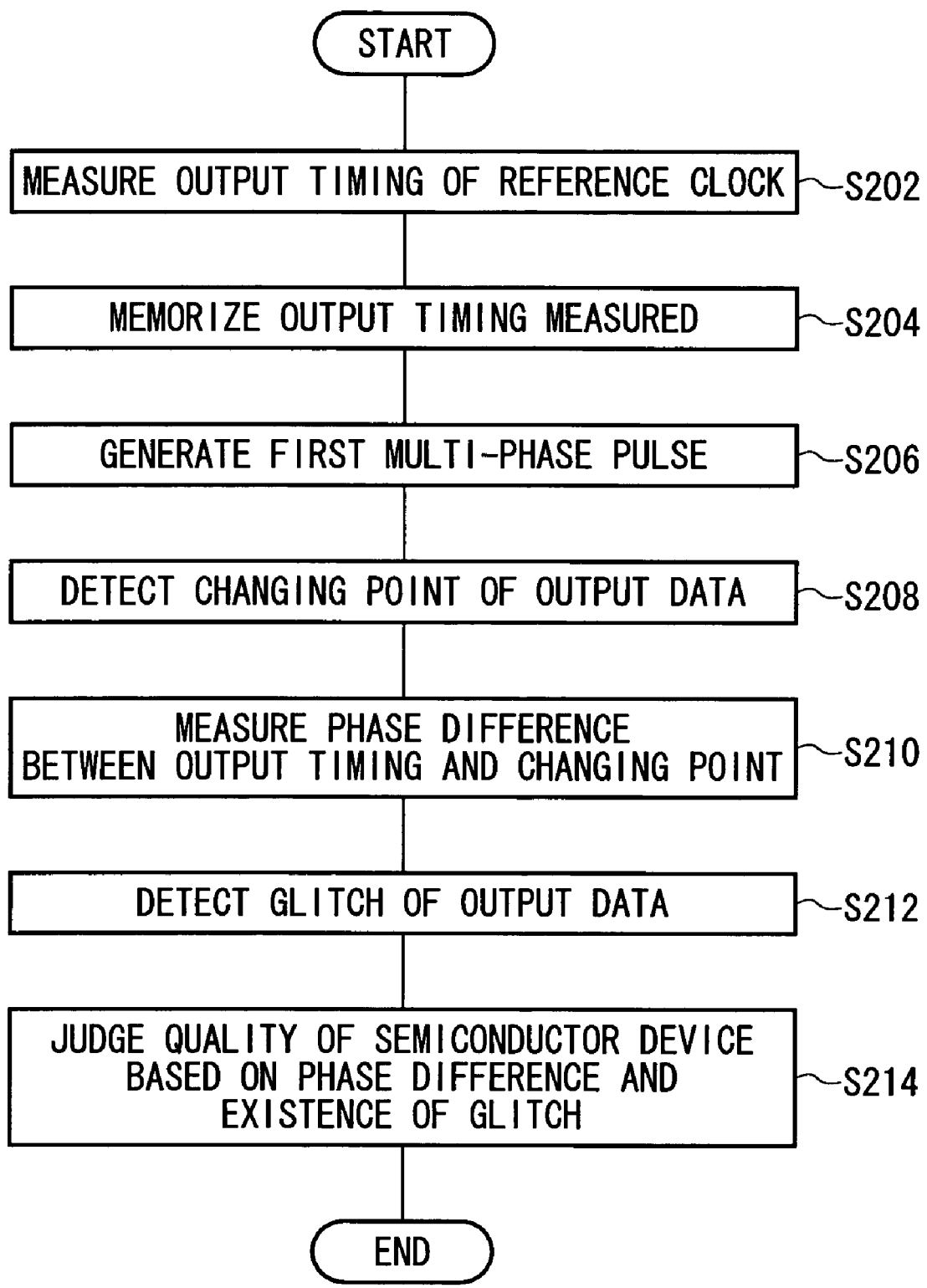
FIG. 24 shows a flowchart of another embodiment of a method for testing a semiconductor device relating to the present invention.
Figure 25:
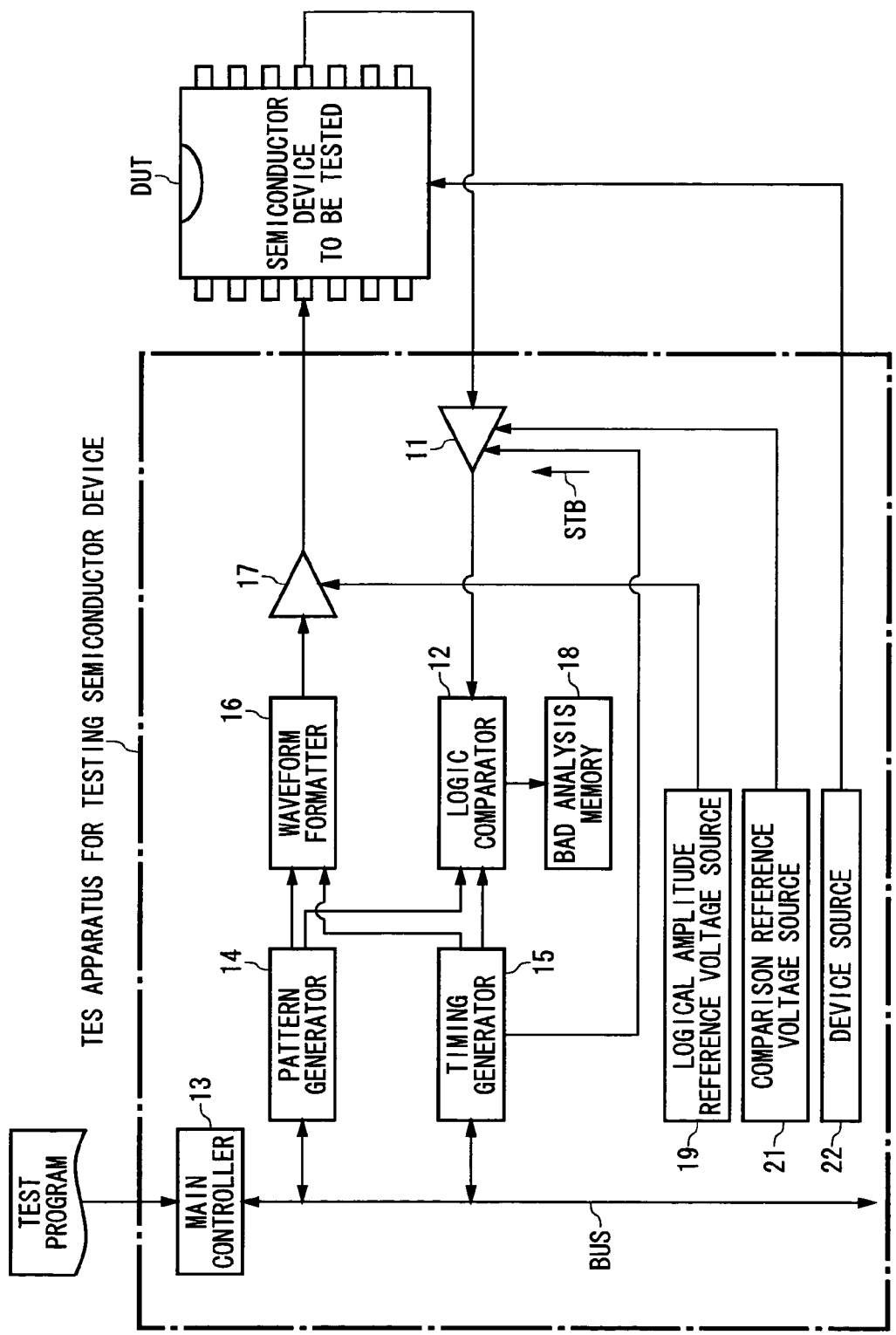
FIG. 25 shows a configuration of a conventional apparatus for testing a semiconductor device.
Figure 26:
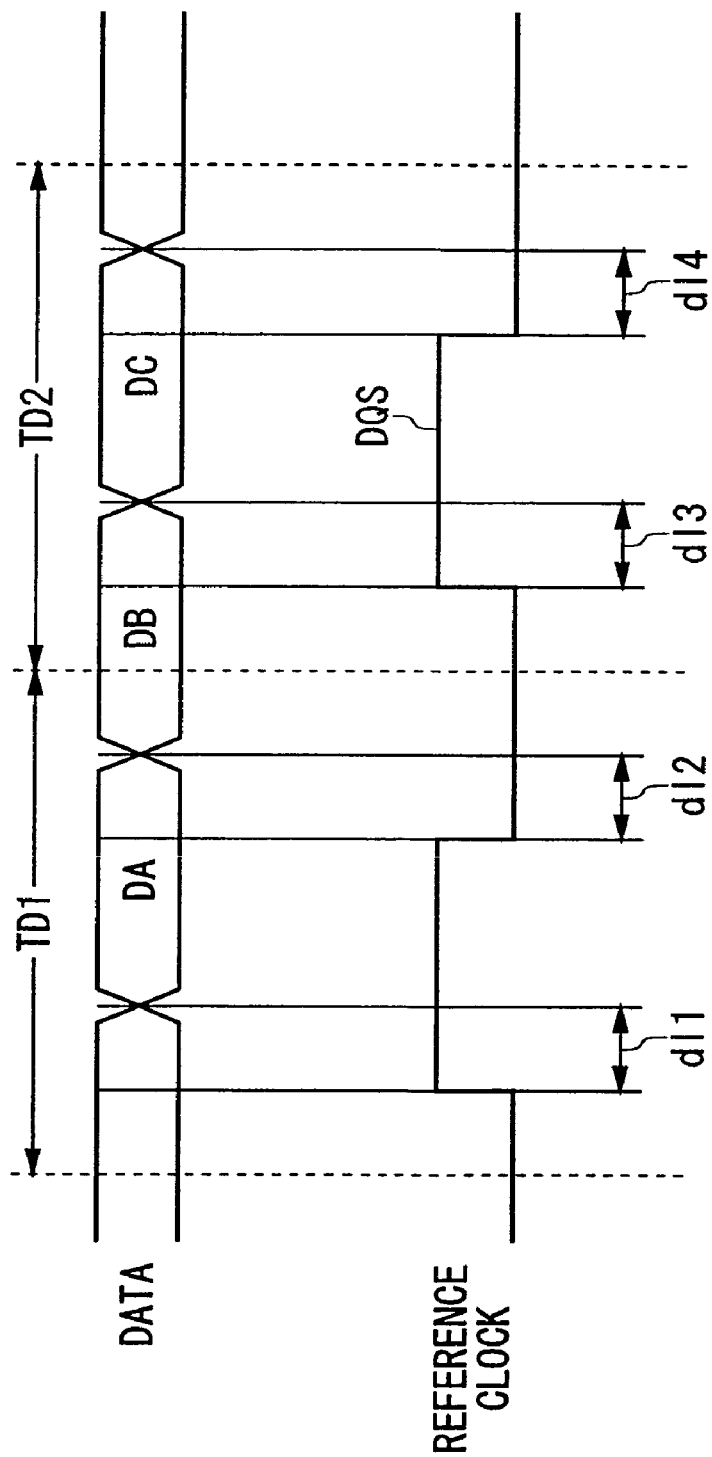
FIGS. 26A and 26B show a state of reading of a memory.
Figure 27:
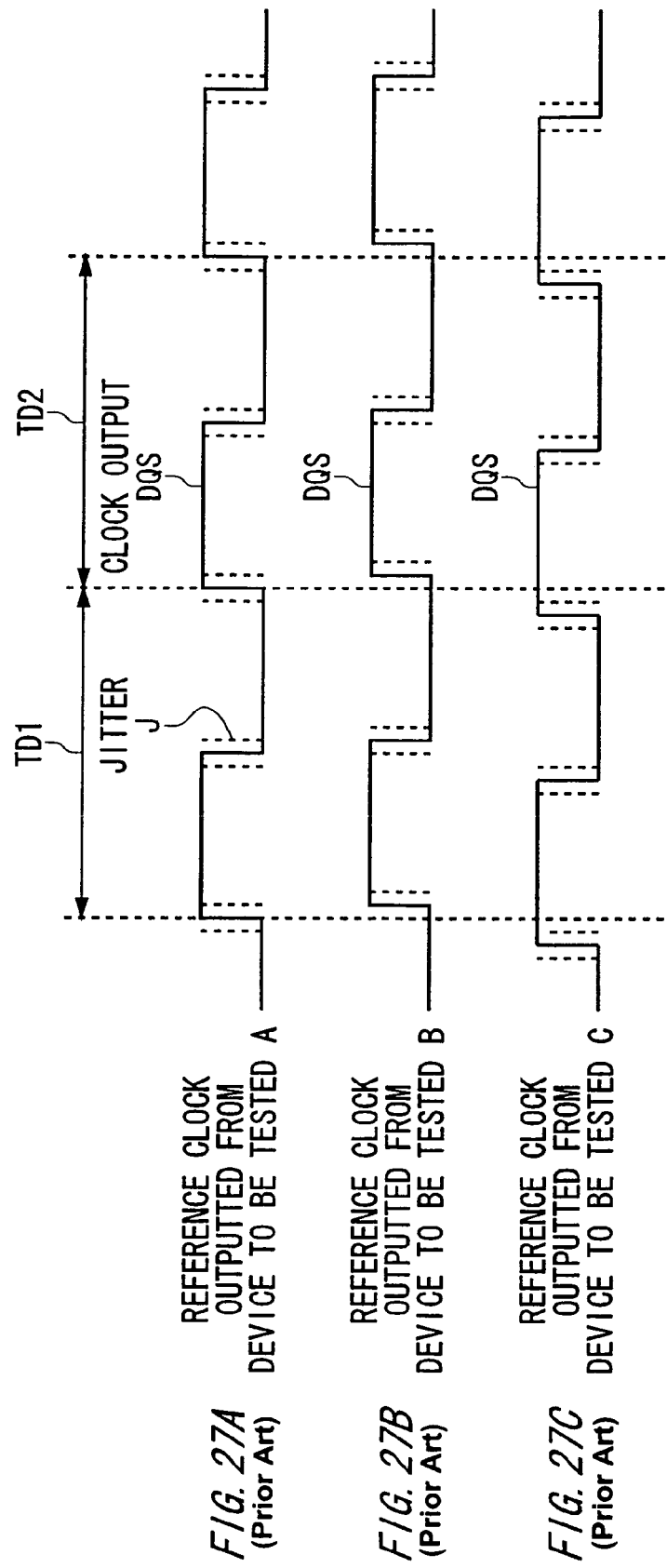
FIGS. 27A, 27B and 27C are timing charts showing a phenomenon that the differences between phases of reference clocks DQS1, DQS2, DQS3 . . . occur for every semiconductor device.

FIG. 24 shows a flowchart of another embodiment of a method for testing a semiconductor device relating to the present invention. First, in a reference phase measuring step, the output timing of the reference clock is measured (S202). In S202, the output timing of the reference clock may be measured by using, for example, the reference phase measuring unit 172 described in relation to FIG. 2.

Then, in a reference phase memorizing step, the output timing measured is memorized (S204). In S204, the output timing may be measured by using, for example, the memory 32 described in relation to FIG. 2.

Then, in a first multi-strobe generating step, the first multi-strobe having a plurality of strobes, of which the phases are different by a small amount, is generated for the output data of a semiconductor device (S206). In S206, the first multi-strobe may be generated by using, for example, the first multi-strobe generator 34 described in relation to FIG. 2 or the first multi-strobe generator 154 described in relation to FIG. 18.

Then, in an output data transition point detecting step, the timing of rising or falling of the waveform of the output data is detected based on the first multi-strobe (S208). In S208, the timing of rising or falling of the waveform of the output data may be detected by using, for example, the output data transition point detector 142 described in relation to FIG. 18.

Then, in a phase difference measuring step, the phase difference between the output timing of the reference clock DQS and the transition point of the value of the output data is measured (S210). In S210, the phase difference may be measured by using, for example, the logic comparator 12 described in relation to FIG. 2.

Then, in a glitch detecting step, the existence of the glitch in regard to the output data is detected based on the transition point of the value of the output data (S212). In S212, the existence of the glitch may be detected by using, for example, the detector 146 described in relation to FIG. 18.

Then, in a judging step, the quality of the semiconductor device is judged based on the existence of the glitch detected in the glitch detecting step S212 and the phase difference measured in S210 (S214). For example, in S214, the quality of the semiconductor device may be judged in the same method as the judging step described in relation to FIG. 23.

According to the method for testing a semiconductor device described above, it is possible to detect the rising or falling of the waveform of the output data and the reference clock DQS in a considerably short time, and thus the test can be performed effectively. In addition, it is possible to easily detect the existence of the glitch in regard to the output data, and therefore the test can be performed with high accuracy.

Although the present invention has been described by way of exemplary embodiments, it should be understood that those skilled in the art might make many changes and substitutions without departing from the spirit and the scope of the present invention, which is defined only by the appended claims.

As obvious from the description above, according to the present invention, it is possible to detect the timing of rising or falling of the waveform of the output data and the reference clock DQS of the semiconductor device in a considerably short time, and to calculate the phase difference of the output data and the reference clock. Due to this, it is possible to perform the test effectively. In addition, it is possible to easily detect the existence of the glitch, and therefore the test can be performed with high accuracy.

What is claimed is:

1. An apparatus for testing a semiconductor device based on output data of said semiconductor device, comprising:
   a multi-strobe generator configured to generate a multi-strobe having a plurality of strobes, of which phases are different by a small amount;
   an output data transition point detector configured to detect a timing of rising or falling of a waveform of said output data based on said multi-strobe;
   a reference clock transition point detector configured to detect a timing of rising or falling of a reference clock outputted by said semiconductor device accompanying said output data, wherein said reference clock is a signal to set a timing of passing said output data, based on said multi-strobe;
   a judging unit configured to judge quality of said semiconductor device based on said timing of a timing of rising or falling of a waveform of said output data detected by said output data transition point detector and said timing of rising or falling of a waveform of said reference clock detected by said reference clock transition point detector; and
   a glitch detector configured to detect existence of a glitch in regard to said output data based on said timing of rising or falling of a waveform of said output data detected by said output data transition point detector.

2. The apparatus for testing a semiconductor device as claimed in claim 1, wherein said judging unit judges quality of said semiconductor device based on whether or not a phase difference between said timing of rising or falling of a waveform of said output data detected by said output data transition point detector and said timing of rising or falling of a waveform of said reference clock detected by said reference clock transition point detector is within a predetermined range.

3. The apparatus for testing a semiconductor device as claimed in claim 1, wherein said multi-strobe generator generates a first multi-strobe in order to detect a transition point of a value of said output data and a second multi-strobe in order to detect a transition point of a value of said reference clock.

4. The apparatus for testing a semiconductor device as claimed in claim 3, further comprising a level comparator configured to change said output data and said reference clock into digital data represented by H logic or L logic, wherein
   said output data transition point detector detects a value of said output data changed into said digital data in regard to a phase of each of strobes of said first multi-strobe, and if a value of said output data in regard to a phase of a first strobe of said first multi-strobe and a value of said output data in regard to a phase of a second strobe adjacent to said first strobe are different then determines said phase of said first strobe as said transition point of said value of said output data,
   said reference clock transition point detector detects a value of said reference clock changed into said digital data in regard to a phase of each of strobes of said second multi-strobe, and if a value of said reference clock in regard to a phase of a third strobe of said second multi-strobe and a value of said reference clock in regard to a phase of a fourth strobe adjacent to said third strobe are different then determines said phase of said third strobe as said transition point of said value of said reference clock, and said judging unit judges quality of said semiconductor device based on said transition point of said value of said output data and said transition point of said value of said reference clock.

5. The apparatus for testing a semiconductor device as claimed in claim 4, wherein said judging unit judges quality of said semiconductor device based on whether or not a difference between a strobe number of said first multi-strobe indicating which timing of a strobe of said first multi-strobe said output data transition point detector detects said transition point of a value of said output data and a strobe number of said second multi-strobe indicating which timing of a strobe of said second multi-strobe said reference clock transition point detector detects said transition point of a value of said reference clock at is within a predetermined range.

6. The apparatus for testing a semiconductor device as claimed in claim 4, wherein said judging unit comprises a memory configured to store a reference table to set quality of said semiconductor device about a combination of said strobe number of said first multi-strobe, in which said transition point of a value of said output data is detected and said strobe number of said second multi-strobe, in which said transition point of a value of said reference clock is detected, and judges quality of said semiconductor device based on said reference table.

7. The apparatus for testing a semiconductor device as claimed in claim 4, wherein said output data transition point detector comprises means for detecting whether a value of digital data in regard to said transition point of a value of said output data changes from said H logic to said L logic or changes from said L logic to said H logic.

8. The apparatus for testing a semiconductor device as claimed in claim 7, wherein the apparatus further comprises a memory and stores a result of the glitch detector in the memory in association with said transition point of a value of said output data.

9. The apparatus for testing a semiconductor device as claimed in claim 4, wherein said output data transition point detector takes a transition point of an earliest phase or a transition point of a latest phase as said transition point of a value of said output data if a plurality of said transition points of a value of said output data are detected.

10. The apparatus for testing a semiconductor device as claimed in claim 1, wherein said judging unit judges quality of said semiconductor device further based on existence of said glitch detected by said glitch detector.

11. The apparatus for testing a semiconductor device as claimed in claim 1, wherein said glitch detector detects existence of a glitch in regard to said output data based on said transition point of a value of said output data.

12. An The apparatus for testing a semiconductor device as claimed in claim 11, wherein said glitch detector judges that there is said glitch of said output data if said transition points of a value of said output data are more than or equal to two.

13. The apparatus for testing a semiconductor device as claimed in claim 1, wherein said multi-strobe generator comprises a plurality of delay devices having different delay times, supplies a strobe to each of said plurality of delay devices and outputs a plurality of strobes, delayed to have a different time delay respectively and outputud by said plurality of delay devices, as said multi-strobe.

14. The apparatus for testing a semiconductor device as claimed in claim 13, wherein said multi-strobe generator comprises a plurality of delay devices connected in cascade, supplies a strobe to each of said plurality of delay devices connected in cascade and generates said multi-strobe based on strobes delayed respectively and outputted by said plurality of delay devices.

15. The apparatus for testing a semiconductor device as claimed in claim 1, wherein the apparatus further comprises a memory and stores a result of the glitch detector in the memory in association with said transition point of a value of said output data.

16. An apparatus for testing a semiconductor device based on output data of said semiconductor device, comprising:

a first multi-strobe generator configured to generate a first multi-strobe having a plurality of strobes, of which phases are different by a small amount in regard to said output data;

a reference phase measuring unit configured to measure an output timing being a timing of rising or falling of a waveform of a reference clock which is a signal to set a timing of passing said output data and is outputted by said semiconductor device accompanied by said output data;

a reference phase memory configured to memorize said output timing;

a transition point detector for detecting a transition point of a value of said output data based on said first multi-strobe;

a phase difference measuring unit configured to measure a phase difference between said output timing and said transition point of a value of said output data;

a judging unit configured to judge quality of said semiconductor device based on said phase difference; and a glitch detector configured to detect existence of a glitch in regard to said transition point of a value of said output data.

17. The apparatus for testing a semiconductor device as claimed in claim 16, wherein said transition point detector comprises means for changing said output data into digital data represented by H logic or L logic, and said transition point detector detects a value of said output data in regard to a phase of each of strobes of said first multi-strobe, and if a value of digital data in regard to a phase of a first strobe of said first multi-strobe and a value of digital data in regard to a phase of a second strobe adjacent to said first strobe are different then determines said phase of said first strobe as said transition point of said value of said output data.

18. The apparatus for testing a semiconductor device as claimed in claim 17, wherein said transition point detector comprises means for detecting whether said value of digital data in regard to said transition point changes from said H logic to said L logic or changes from said L logic to said H logic.

19. The apparatus for testing a semiconductor device as claimed in claim 18, wherein said transition point detector takes a transition point of an earliest phase or a transition point of a latest phase as said transition point of a value of said output data if a plurality of said transition points of a value of said output data is detected.

20. The apparatus for testing a semiconductor device as claimed in claim 18, wherein the apparatus further comprises a memory and stores a result of the glitch detector in the memory in association with said transition point of a value of said output data.

21. An The apparatus for testing a semiconductor device as claimed in claim 16, wherein said reference phase measuring unit comprises:
  means for generating a second multi-strobe having a plurality of strobes, of which phases are different by a small amount, in regard to said reference clock;
  means for detecting said transition point of a value of said reference clock based on said second multi-strobe; and
  means for calculating said output timing of said reference clock based on a strobe number of said second multi-strobe, in which said transition point of a value of said reference clock is detected.

22. The apparatus for testing a semiconductor device as claimed in claim 21, wherein said reference phase memory stores said strobe number of said second multi-strobe, in which said transition point of a value of said reference clock is detected.

23. The apparatus for testing a semiconductor device as claimed in claim 22, wherein said first multi-strobe generator sets a phase of said first multi-strobe based on said strobe number of said second multi-strobe stored by said reference phase memory.

24. The apparatus for testing a semiconductor device as claimed in claim 16, wherein said judging unit judges quality of said semiconductor device further based on existence of said glitch detected by said glitch detector.

25. The apparatus for testing a semiconductor device as claimed in claim 16, wherein said glitch detector judges that there is said glitch of said output data if said transition points of a value of said output data detected by said transition point detector are more than or equal to two.

26. The apparatus for testing a semiconductor device as claimed in claim 16, wherein said first multi-strobe generator comprises a plurality of delay devices connected in cascade, supplies a strobe to said plurality of delay devices connected in cascade, and generates said first multi-strobe based on strobes delayed respectively and outputted by said plurality of delay devices.

27. The apparatus for testing a semiconductor device as claimed in claim 16, wherein the apparatus further comprises a memory and stores a result of the glitch detector in the memory in association with said transition point of a value of said output data.

28. A method for testing a semiconductor device based on output data of said semiconductor device, comprising:
  a first multi-strobe generating step of generating a first multi-strobe having a plurality of strobes, of which phases are different by a small amount, in regard to said output data;
  an output data transition point detecting step of detecting a timing of rising or falling of a waveform of said output data based on said first multi-strobe;
  a second multi-strobe generating step of generating a second multi-strobe having a plurality of strobes, of which phases are different by a small amount, in regard to a reference clock, which is a signal to set a timing of passing said output data, said reference clock being outputted by said semiconductor device accompanying said output data;
  a reference clock transition point detecting step of detecting a timing of rising or falling of a waveform of said reference clock based on said second multi-strobe;
  a judging step of judging quality of said semiconductor device based on said timing of rising or falling of a waveform of said output data detected in said output data transition point detecting step and said timing of rising or falling of a waveform of said reference clock detected in said reference clock transition point detecting step;
  an outputting step of outputting said judging quality of said semiconductor device; and
  a glitch detecting step of detecting existence of a glitch in regard to said output data based on said transition point of a value of said output data,
  wherein said judging step judges quality of said semiconductor device further based on existence of said glitch detected in said glitch detecting step.

29. The apparatus for testing a semiconductor device as claimed in claim 28, wherein the apparatus further comprises a memory and stores a result of the glitch detector in the memory in association with said transition point of a value of said output data.

30. A method for testing a semiconductor device based on output data of said semiconductor device, comprising:
  a reference phase measurement step of measuring an output timing of a reference clock, which is a signal to set a timing of passing said output data, said reference clock being outputted by said semiconductor device accompanying said output data;
  a reference phase memorizing step of memorizing said output timing;
  a first multi-strobe generating step of generating a first multi-strobe having a plurality of strobes, of which phases are different by a small amount, in regard to said output data;
  an output data transition point detecting step of detecting said transition point of a value of said output data based on said first multi-strobe;
  a phase difference measuring step of measuring a phase difference between said output timing and said transition point of a value of said output data;
  a judging step of judging quality of said semiconductor device based on said phase difference;
  an outputting step of outputting said judging quality of said semiconductor device; and
  a glitch detecting step of detecting existence of a glitch in regard to said output data based on said transition point of a value of said output data.

31. The apparatus for testing a semiconductor device as claimed in claim 30, wherein the apparatus further comprises a memory and stores a result of the glitch detector in the memory in association with said transition point of a value of said output data.

32. An apparatus for testing a semiconductor device based on output data of said semiconductor device, comprising:
  a multi-strobe generator configured to generate a multi-strobe having a plurality of strobes, of which phases are different by a small amount;
  an output data transition point detector configured to detect a timing of rising or falling of a waveform of said output data based on said multi-strobe;
  a reference clock transition point detector configured to detect a timing of rising or falling of a reference clock outputted by said semiconductor device accompanying said output data, wherein said reference clock is a signal to set a timing of passing said output data, based on said multi-strobe;
  a judging unit configured to judge quality of said semiconductor device based on said timing of a timing of rising or falling of a waveform of said output data detected by said output data transition point detector and said timing of rising or falling of a waveform of said reference clock detected by said reference clock transition point detector;

a level comparator configured to change said output data and said reference clock into digital data represented by H logic or L logic, wherein said multi-strobe generator generates a first multi-strobe in order to detect a transition point of a value of said output data and a second multi-strobe in order to detect a transition point of a value of said reference clock, wherein said output data transition point detector detects a value of said output data changed into said digital data in regard to a phase of each of strobes of said first multi-strobe, and if a value of said output data in regard to a phase of a first strobe of said first multi-strobe and a value of said output data in regard to a phase of a second strobe adjacent to said first strobe are different then determines said phase of said first strobe as said transition point of said value of said output data, wherein said reference clock transition point detector detects a value of said reference clock changed into said digital data in regard to a phase of each of strobes of said second multi-strobe, and if a value of said reference clock in regard to a phase of a third strobe of said second multi-strobe and a value of said reference clock in regard to a phase of a fourth strobe adjacent to said third strobe are different then determines said phase of said third strobe as said transition point of said value of said reference clock, wherein said judging unit judges quality of said semiconductor device based on said transition point of said value of said output data and said transition point of said value of said reference clock, and wherein said output data transition point detector takes a transition point of an earliest phase or a transition point of a latest phase as said transition point of a value of said output data if a plurality of said transition points of a value of said output data are detected.

33. The apparatus for testing a semiconductor device as claimed in claim 32, wherein said multi-strobe generator comprises a plurality of delay devices having different delay times, supplies a strobe to each of said plurality of delay devices and outputs a plurality of strobes, delayed to have a different time delay respectively and outputted by said plurality of delay devices, as said multi-strobe.

34. The apparatus for testing a semiconductor device as claimed in claim 33, wherein said multi-strobe generator comprises a plurality of delay devices connected in cascade, supplies a strobe to each of said plurality of delay devices connected in cascade and generates said multi-strobe based on strobes delayed respectively and outputted by said plurality of delay device.

35. The apparatus for testing a semiconductor device as claimed in claim 32, whereiii said output data transition point detector comprises means for detecting whether a value of digital data in regard to said transition point of a value of said output data changes from said H logic to said L logic or changes from said L logic to said H logic.

36. The apparatus for testing a semiconductor device as claimed in claim 35, wherein the apparatus further comprises a memory and stores a result of the glitch detector in the memory in association with said transition point of a value of said output data.

37. The apparatus for testing a semiconductor device as claimed in claim 32, wherein said judging unit judges quality of said semiconductor device based on whether or not a phase difference between said timing of rising or falling of a waveform of said output data detected by said output data transition point detector and said timing of rising or falling of a waveform of said reference clock detected by said reference clock transition point detector is within a predetermined range.

38. The apparatus for testing a semiconductor device as claimed in claim 32, wherein said judging unit judges quality of said semiconductor device based on whether or riot a difference between a strobe number of said first multi-strobe indicating which timing of astrobe of said first multi-strobe said output data transition point detector detects said transition point of a value of said output data and a strobe number of said second multi-strobe indicating which timing of a strobe of said second multi-strobe said reference clock transition point detector detects said transition point of a value of said reference clock at is within a predetermined range.

39. The apparatus for testing a semiconductor device as claimed in claim 32, wherein said judging unit comprises a memory configured to store a reference table to set quality of said semiconductor device about a combination of said strobe number of said first multi-strobe, in which said transition point of a value of said output data is detected and said strobe number of said second multi-strobe, in which said transition point of a value of said reference clock is detected, and judges quality of said semiconductor device based on said reference table.

40. The apparatus for testing a semiconductor device as claimed in claim 32, further comprising a glitch detector configured to detect existence of a glitch in regard to said output data based on said timing of rising or falling of a waveform of said output data detected by said output data transition point detector.

41. The apparatus for testing a semiconductor device as claimed in claim 40, wherein said judging unit judges quality of said semiconductor device further based on existence of said glitch detected by said glitch detector.

42. The apparatus for testing a semiconductor device as claimed in claim 40, wherein said glitch detector detects existence of a glitch in regard to said output data based on said transition point of a value of said output data.

43. The apparatus for testing a semiconductor device as claimed in claim 42, wherein said glitch detector judges that there is said glitch of said output data if said transition points of a value of said output data are more than or equal to two.

44. The apparatus for testing a semiconductor device as claimed in claim 40, wherein the apparatus further comprises a memory and stores a result of the glitch detector in the memory in association with said transition point of a value of said output data.

45. An apparatus for testing a semiconductor device based on output data of said semiconductor device, comprising:

a first multi-strobe generator configured to generate a first multi-strobe having a plurality of strobes, of which phases are different by a small amount in regard to said output data;

a reference phase measuring unit configured to measure an output timing being a timing of rising or falling of a waveform of a reference clock which is a signal to set a timing of passing said output data and is outputted by said semiconductor device accompanied by said output data;

a reference phase memory configured to memorize said output timing;

a transition point detector configured to detect a transition point of a value of said output data based on said first multi-strobe;

a phase difference measuring unit configured to measure a phase difference between said output timing and said transition point of a value of said output data; and a judging unit configured to judge quality of said semiconductor device based on said phase difference, wherein said transition point detector comprises means for changing said output data into digital data represented by H logic or L logic, and said transition point detector detects a value of said output data in regard to a phase of each of strobes of said first multi-strobe, and if a value of digital data in regard to a phase of a first strobe of said first multi-strobe and a value of digital data in regard to a phase of a second strobe adjacent to said first strobe are different then determines said phase of said first strobe as said transition point of said value of said output data, wherein said transition point detector comprises means for detecting whether said value of digital data in regard to said transition point changes from said H logic to said L logic or changes from said L logic to said H logic, and wherein said transition point detector takes a transition point of an earliest phase or a transition point of a latest phase as said transition point of a value of said output data if a plurality of said transition points of a value of said output data is detected.

46. The apparatus for testing a semiconductor device as claimed in claim 45, wherein the apparatus further comprises a memory and stores a result of the glitch detector in the memory in association with said transition point of a value of said output data.

47. The apparatus for testing a semiconductor device as claimed in claim 45, further comprising a glitch detector configured to detect existence of a glitch in regard to said transition point of a value of said output data.

48. The apparatus for testing a semiconductor device as claimed in claim 47, wherein said judging unit judges quality of said semiconductor device further based on existence of said glitch detected by said glitch detector.

49. The apparatus for testing a semiconductor device as claimed in claim 47, wherein said glitch detector judges that there is said glitch of said output data if said transition points of a value of said output data detected by said transition point detector are more than or equal to two.

50. The apparatus for testing a semiconductor device as claimed in claim 47, wherein the apparatus further comprises a memory and stores a result of the glitch detector in the memory in association with said transition point of a value of said output data.

51. The apparatus for testing a semiconductor device as claimed in claim 45, wherein said reference phase measuring unit comprises:

means for generating a second multi-strobe having a plurality of strobes, of which phases are different by a small amount, in regard to said reference clock;

means for detecting said transition point of a value of said reference clock based on said second multi-strobe; and means for calculating said output timing of said reference clock based on a strobe number of said second multi-strobe, in which said transition point of a value of said reference clock is detected.

52. The apparatus for testing a semiconductor device as claimed in claim 51, wherein said reference phase memory stores said strobe number of said second multi-strobe, in which said transition point of a value of said reference clock is detected.

53. The apparatus for testing a semiconductor device as claimed in claim 52, wherein said first multi-strobe generator sets a phase of said first multi-strobe based on said strobe number of said second multi-strobe stored by said reference phase memory.

54. The apparatus for testing a semiconductor device as claimed in claim 45, wherein said first multi-strobe generator comprises a plurality of delay devices connected in cascade, supplies a strobe to said plurality of delay devices connected in cascade, and generates said first multi-strobe based on strobes delayed respectively and outputted by said plurality of delay devices.

* * * * *

UNITED STATES PATENT AND TRADEMARK OFFICE
CERTIFICATE OF CORRECTION

PATENT NO. : 7,283,920 B2
APPLICATION NO. : 10/732763
DATED : October 16, 2007
INVENTOR(S) : Masaru Doi et al.

It is certified that error appears in the above-identified patent and that said Letters Patent is hereby corrected as shown below:

In the Drawings:

In the drawings, sheet 24 of 28, figure number 25 is incorrect. Please replace the drawing with the replacement drawing enclosed.

In Claim 12, column 29, line 27, the word "An" should be deleted.

In Claim 21, column 31, line 4, the "An" should be deleted.

In Claim 35, column 33, line 55, the word "whereiii" should be --wherein--.

In Claim 38, column 34, line 10, the word "riot" should be --not--.

In Claim 38, column 34, line 11, the word "astrobe" should be --a strobe--.

Signed and Sealed this

Ninth Day of September, 2008

JON W. DUDAS
*Director of the United States Patent and Trademark Office*